(12) United States Patent
Bykanov

(10) Patent No.: US 7,449,703 B2
(45) Date of Patent: Nov. 11, 2008

(54) METHOD AND APPARATUS FOR EUV PLASMA SOURCE TARGET DELIVERY TARGET MATERIAL HANDLING

(75) Inventor: Alexander N. Bykanov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 798 days.

(21) Appl. No.: 11/067,073

(22) Filed: Feb. 25, 2005

(65) Prior Publication Data
US 2006/0193997 A1    Aug. 31, 2006

(51) Int. Cl.
*H05G 2/00* (2006.01)
(52) U.S. Cl. .................. 250/504 R; 378/119
(58) Field of Classification Search ........... 250/504 R, 250/493.1; 378/119, 143
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,364,342 A | 12/1982 | Asik | 123/143 |
| 4,369,758 A | 1/1983 | Endo | 123/620 |
| 4,504,964 A | 3/1985 | Cartz et al. | 378/119 |
| 4,507,588 A | 3/1985 | Asmussen et al. | 315/39 |
| 4,536,884 A | 8/1985 | Weiss et al. | 378/119 |

(Continued)

FOREIGN PATENT DOCUMENTS

JP    2000091096 A    3/2000

OTHER PUBLICATIONS

Andreev, et al., "Enhancement of laser/EUV conversion by shaped laser pulse interacting with Li-contained targets for EUV lithography", Proc. Of *SPIE*, 5196:128-136, (2004).

(Continued)

*Primary Examiner*—Kiet T Nguyen
(74) *Attorney, Agent, or Firm*—William C. Cray

(57) ABSTRACT

An EUV target delivery system and method are disclosed which may comprise: a target material purification system connected to deliver liquid target material comprising: a first container and a second container in fluid contact with the target material reservoir; a filter intermediate the first chamber and the second chamber; a liquid target material agitation mechanism, or at least one purification chamber containing the target material in a form reactive with impurities contained in the inert gas reacting with such impurities and removing from the inert gas the impurities, or providing an evaporation chamber in fluid communication with an impurity chamber and with a target droplet mechanism liquid target material reservoir and containing liquid source material; heating the liquid source material to a first temperature sufficient to evaporate a first set of contaminants; heating the liquid source material to a second temperature sufficient to evaporate lithium.

54 Claims, 10 Drawing Sheets

U.S. PATENT DOCUMENTS

| | | | |
|---|---|---|---|
| 4,538,291 A | 8/1985 | Iwamatsu | 378/119 |
| 4,561,406 A | 12/1985 | Ward | 123/536 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,774,914 A | 10/1988 | Ward | 123/162 |
| 4,837,794 A | 6/1989 | Riordan et al. | 378/119 |
| 4,928,020 A | 5/1990 | Birx et al. | 307/106 |
| 5,023,897 A | 6/1991 | Neff et al. | 378/122 |
| 5,027,076 A | 6/1991 | Horsley et al. | 324/674 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,171,360 A | 12/1992 | Orme et al. | 75/331 |
| 5,175,755 A | 12/1992 | Kumakhov | 378/34 |
| 5,226,948 A | 7/1993 | Orme et al. | 75/331 |
| 5,259,593 A | 11/1993 | Orme et al. | 266/78 |
| 5,313,481 A | 5/1994 | Cook et al. | 372/37 |
| 5,319,695 A | 6/1994 | Itoh et al. | 378/84 |
| 5,340,090 A | 8/1994 | Orme et al. | 266/202 |
| RE34,806 E | 12/1994 | Cann | 427/446 |
| 5,411,224 A | 5/1995 | Dearman et al. | 244/53 |
| 5,448,580 A | 9/1995 | Birx et al. | 372/38 |
| 5,504,795 A | 4/1996 | McGeoch | 378/119 |
| 5,577,091 A * | 11/1996 | Richardson et al. | 378/119 |
| 5,729,562 A | 3/1998 | Birx et al. | 372/38 |
| 5,763,930 A | 6/1998 | Partlo | 250/504 |
| 5,866,871 A | 2/1999 | Birx | 219/121 |
| 5,894,980 A | 4/1999 | Orme-Marmarelis et al. | 228/33 |
| 5,894,985 A | 4/1999 | Orme-Marmarelis et al. | 228/262 |
| 5,936,988 A | 8/1999 | Partlo et al. | 372/38 |
| 5,938,102 A | 8/1999 | Muntz et al. | 228/102 |
| 5,963,616 A | 10/1999 | Silfvast et al. | 378/122 |
| 5,970,076 A | 10/1999 | Hamada | 372/20 |
| 6,031,241 A | 2/2000 | Silfvast et al. | 250/504 |
| 6,031,598 A | 2/2000 | Tichenor et al. | 355/67 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,172,324 B1 | 1/2001 | Birx | 219/121.57 |
| 6,186,192 B1 | 2/2001 | Orme-Marmarelis et al. | 141/18 |
| 6,195,272 B1 | 2/2001 | Pascente | 363/21 |
| 6,224,180 B1 | 5/2001 | Pham-Van-Diep et al. | 347/2 |
| 6,228,512 B1 | 5/2001 | Bajt et al. | 428/635 |
| 6,264,090 B1 | 7/2001 | Muntz et al. | 228/33 |
| 6,276,589 B1 | 8/2001 | Watts, Jr. et al. | 228/33 |
| 6,285,743 B1 | 9/2001 | Kondo et al. | 378/119 |
| 6,307,913 B1 | 10/2001 | Foster et al. | 378/34 |
| 6,317,448 B1 | 11/2001 | Das et al. | 372/32 |
| 6,377,651 B1 | 4/2002 | Richardson et al. | 378/34 |
| 6,396,900 B1 | 5/2002 | Barbee, Jr. et al. | 378/84 |
| 6,449,086 B1 | 9/2002 | Singh | 359/361 |
| 6,452,194 B2 | 9/2002 | Bijkerk et al. | 250/492.2 |
| 6,452,199 B1 | 9/2002 | Partlo et al. | 250/504 |
| 6,491,737 B2 | 12/2002 | Orme-Marmerelis et al. | 75/335 |
| 6,493,423 B1 | 12/2002 | Bisschops | 378/119 |
| 6,520,402 B2 | 2/2003 | Orme-Marmerelis et al. | 228/260 |
| 6,562,099 B2 | 5/2003 | Orme-Marmarelis et al. | 75/335 |
| 6,566,667 B1 | 5/2003 | Partlo et al. | 250/504 |
| 6,566,668 B2 | 5/2003 | Rauch et al. | 250/504 |
| 6,576,912 B2 | 6/2003 | Visser et al. | 250/492.2 |
| 6,580,517 B2 | 6/2003 | Lokai et al. | 356/519 |
| 6,586,757 B2 | 7/2003 | Melnychuk et al. | 250/504 |
| 6,590,959 B2 | 7/2003 | Kandaka et al. | 378/119 |
| 6,647,086 B2 | 11/2003 | Amemiya et al. | 378/34 |
| 6,656,575 B2 | 12/2003 | Bijkerk et al. | 428/212 |
| 6,724,462 B1 | 4/2004 | Singh et al. | 355/53 |
| 6,744,060 B2 | 6/2004 | Ness et al. | 315/111.01 |
| 6,804,327 B2 | 10/2004 | Schriever et al. | 378/119 |
| 6,815,700 B2 | 11/2004 | Melnychuk et al. | 250/504 |
| 6,865,255 B2 | 3/2005 | Richardson | 378/119 |
| 2003/0068012 A1 | 4/2003 | Ahmad et al. | 378/119 |
| 2003/0196512 A1 | 10/2003 | Wyszomierski et al. | 75/336 |
| 2003/0219056 A1 | 11/2003 | Yager et al. | 372/57 |

OTHER PUBLICATIONS

Apruzese, J.P., "X-Ray Laser Research Using Z Pinches," *Am. Inst. of Phys.* 399-403, (1994).

Bal et al., "Optimizing multiplayer coatings for Extreme UV projection systems," Faculty of Applied Sciences, Delft University of Technology. No date.

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 66(4):401-406, (1998).

Braun, et al., "Multi-component EUV Multilayer Mirrors," *Proc. SPIE*, 5037:2-13, (2003).

Choi, et al., "A $10^{13}$ A/s High Energy Density Micro Discharge Radiation Source," *B. Radiation Characteristics*, p. 287-290. No date.

Choi, et al., "Fast pulsed hollow cathode capillary discharge device," *Rev. of Sci. Instrum.* 69(9):3118-3122 (1998).

Choi et al., Temporal development of hard and soft x-ray emission from a gas-puff Z pinch, Rev. Sci. Instrum. 57(8), pp. 2162-2164 (Aug. 1986).

Eichler, et al., "Phase conjugation for realizing lasers with diffraction limited beam quality and high average power," Techninische Universitat Berlin, Optisches Institut, (Jun. 1998).

Fedosejevs et al., "Subnanosecond pulses from a KrF Laser pumped $SF_6$ Brillouin Amplifier", IEEE J. QE 21, 1558-1562 (1985).

Feigl, et al., Heat Resistance of EUV Multilayer Mirrors for Long-time Applications, *Microelectric Engineering*, 57-58:3-8, (2001).

Fomenkov, et al., "Characterization of a 13.5nm Source for EUV Lithography based on a Dense Plasma Focus and Lithium Emission," Sematech Intl. Workshop on EUV Lithography (Oct. 1999).

Giordano and Letardi, "Magnetic pulse compressor for prepulse discharge in spiker-sustainer excitati technique for XeCl lasers," Rev. Sci. Instrum 65(8), pp. 2475-2481 (Aug. 1994).

Hansson, et al., "Xenon liquid jet laser-plasma source for EUV lithography," Emerging Lithographic Technologies IV, *Proc. Of SPIE*, vol. 3997:729-732 (2000).

Jahn, Physics of Electric Propulsion, McGraw-Hill Book Company, (Series in Missile and Space U.S.A.), Chap. 9, "Unsteady Electromagnetic Acceleration," p. 257 (1968).

Jiang, et al., "Compact multimode pumped erbium-doped phosphate fiber amplifiers," Optical Engineering, vol. 42, Issue 10, pp. 2817-2820 (Oct. 2003).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

Kjornrattanawanich, Ph.D. Dissertation, U.S. Department of Energy, Lawrence Livermore National Laboratory, Sep. 1, 2002.

Kuwahara et al., "Short-pulse generation by saturated KrF laser amplification of a steep Stokes pulse produced by two-step stimulated Brillouin scattering", J. Opt. Soc. Am. B 17, 1943-1947 (2000).

Lange, Michael R., et al., "High gain coefficient phosphate glass fiber amplifier," NFOEC 2003, paper No. 126.

Lebert, et al., "Soft x-ray emission of laser-produced plasmas using a low-debris cryogenic nitrogen target," *J. App. Phys.*, 84(6):3419-3421 (1998).

Lebert, et al., "A gas discharged based radiation source for EUV-lithography," Intl. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocycloidal pinch apparatus," The Phys. Of Fluids, 20(2):313-321 (1977).

Lewis, Ciaran L.S., "Status of Collision-Pumped X-ray Lasers," Am Inst. Phys. pp. 9-16 (1994).

Lowe, "Gas plasmas yield X-rays for Lithography," Electronics, pp. 40-41 (Jan. 27, 1982).

Malmqvist, et al., "Liquid-jet target for laser-plasma soft x-ray generation," Am. Inst. Phys. 67(12):4150-4153 (1996).

Mather, "Formation of a High-Density Deuterium Plasma Focus," The Physics of Fluids, 8(2), 366-377 (Feb. 1965).

Mather, et al., "Stability of the Dense Plasma Focus," Phys. Of Fluids, 12(11):2343-2347 (1969).

Matthews and Cooper, "Plasma sources for x-ray lithography," SPIE, 333, Submicron Lithography, pp. 136-139 (1982).

Mayo, et al., "A magnetized coaxial source facility for the generation of energetic plasma flows," Sci. Technol. vol. 4:pp. 47-55 (1994).

Mayo, et al., "Initial Results on high enthalpy plasma generation in a magnetized coaxial source," Fusion Tech vol. 26:1221-1225 (1994).

Montcalm et al., "Mo/Y multiplayer mirrors for the 8-12-nm wavelength region," Optics Letters, 19(15): 1173-1175 (Aug. 1, 1994).

Montcalm et al., "In Situ reflectance measurements of soft-s-ray/extreme-ultraviolet Mo/Y multiplayer mirrors," Optics Letters 20(12): 1450-1452 (Jun. 15, 1995).

Nilsen et al., "Mo:Y multiplayer mirror technology utilized to image the near-field output of a Ni-like Sn laser at 11.9 nm," Optics Letters, 28(22) 2249-2251 (Nov. 15, 2003).

Nilsen, et al., "Analysis of resonantly photopumped Na-Ne x-ray-laser scheme," Am Phys. Soc. 44(7):4591-4597 (1991).

H. Nishioka et al., "UV saturable absorber for short-pulse KrF laser systems", Opt. Lett. 14, 692-694 (1989).

Orme, et al., "Electrostatic charging and deflection of nonconventional droplet streams formed from capillary stream breakup," Physics of Fluids, 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," Physica Sripta, T75:104-111, (1998).

Partlo, et al., "EUV (13.5nm) Light Generation Using a Dense Plasma Focus Device," SPIE Proc. On Emerging Lithographic Technologies III, vol. 3676, 846-858 (Mar. 1999).

Pearlman and Riordan, "X-ray lithography using a pulsed plasma source," J. Vac. Sci. Technol., pp. 1190-1193 (Nov./Dec. 1981).

Porter, et al., "Demonstration of Population Inversion by Resonant Photopumping in a Neon Gas Cell Irradiated by a Sodium Z Pinch," Phys. Rev. Let., 68(6):796-799, (Feb. 1992).

Price, Robert H., "X-Ray Microscopy using Grazing Incidence Reflection Optics," Am. Inst. Phys. , pp. 189-199, (1981).

Qi, et al., "Fluorescence in Mg IX emission at 48.340 Å from Mg pinch plasmas photopumped by Al XI line radiation at 48.338 Å," The Am. Phys. Soc., 47(3):2253-2263 (Mar. 1993).

Sae-Lao et al., "Performance of normal-incidence molybdenum-yttrium multiplayer-coated diffraction grating at a wavelength of 9 nm," Applied Optics, 41(13): 2394-1400 (May 1, 2002).

Sae-Lao et al., "Molybdenum-strontium multiplayer mirrors for the 8-12-nm extreme-ultraviolet wavelength region," Optics Letters, 26(7):468-470, (Apr. 1, 2001).

Sae-Lao et al., "Normal-incidence multiplayer mirrors for the 8-12 nm wavelength region," Information Science and Technology, Lawrence Livermore National Laboratory. No date.

Sae-Lao et al., "Measurements of the refractive index of ytrrium in the 50-1300-eV energy region," Applied Optics, 41(34):7309-7316 (Dec. 1, 2002).

Scheuer, et al., "A Magnetically-Nozzled, Quasi-Steady, Multimegawatt, Coaxial Plasma Thruster," IEEE: Transactions on Plasma Science, 22(6) (Dec. 1994).

S. Schiemann et al., "Efficient temporal compression of coherent nanosecond pulses in a compact SBS generator-amplifier setup", IEEE J. QE 33, 358-366 (1997).

Schriever, et al., "Laser-produced lithium plasma as a narrow-band extended ultraviolet radiation source for photoelectron spectroscopy," App. Optics, 37(7):1243-1248, (Mar. 1998).

Schriever, et al., "Narrowband laser produced extreme ultraviolet sources adapted to silicon/molybdenum multilayer optics," J. of App. Phys., 83(9):4566-4571, (May 1998).

Shiloh et al., "Z Pinch of a Gas Jet," Physical Review Lett., 40(8), pp. 515-518 (Feb. 20, 1978).

Silfvast, et al., "High-power plasma discharge source at 13.5 nm and 11.4 nm for EUV lithography," SPIE, vol. 3676:272-275, (Mar. 1999).

Silfvast, et al., "Lithium hydride capillary discharge creates x-ray plasma at 13.5 namometers," Laser Focus World, p. 13. (Mar. 1997).

Singh et al., "Improved Theoretical Reflectivities of Extreme Ultraviolet Mirrors," Optics Research Group, Faculty of Applied Sciences, Delft University of Technology. No date.

Singh et al., "Design of multiplayer extreme-ultraviolet mirrors for enhanced reflectivity," Applied Optics, 39(13):2189-2197 (May 1, 2000).

Srivastava et al., "High-temperature studies on Mo-Si multilayers using transmission electron microscope," Current Science, 83 (8):997-1000 (Oct. 25, 2002).

Stallings et al., "Imploding argon plasma experiments," Appl. Phys. Lett., 35(7), pp. 524-526 (Oct. 1, 1979).

Takahashi, E., et al., "KrF laser picosecond pulse source by stimulated scattering processes", Opt. Commun. 215, 163-167 (2003).

Takahashi, E., et al., "High-intensity short KrF laser-pulse generation by saturated amplification of truncated leading-edge pulse", Opt. Commun. 185, 431-437 (2000).

Tillack, et al., "Magnetic Confinement of an Expanding Laser-Produced Plasma", UC San Diego, Center for Energy Research, UCSD Report & Abramova—Tornado Trap. No date.

Wilhein, et al., "A slit grating spectrograph for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch X-ray/EUV Point Sources," SPIE, Conf. On Emerging Tech. III, Santa Clara, CA, vol. 3676:410-420, (Mar. 1999).

Zombeck, M.V., "Astrophysical Observations with High Resolution X-ray Telescope," Am. Inst. Of Phys., pp. 200-209, (1981).

* cited by examiner

METHOD AND APPARATUS FOR EUV PLASMA SOURCE TARGET DELIVERY TARGET MATERIAL HANDLING

RELATED APPLICATIONS

The present application is related to co-pending U.S. application Ser. No. 11/021,261, entitled EUV Light Source Optical Elements, filed on Dec. 22, 2004, and Ser. No. 10/979,945, entitled EUV Collector Debris Management, filed on Nov. 1, 2004, Ser. No. 10/979,919, filed on Nov. 1, 2004, entitled LPP EUV Light Source, Ser. No. 10/900,839, entitled EUV Light Source, Ser. No. 10/798,740, entitled Collector For EUV Light Source, the disclosures of which are hereby incorporated by reference, and to co-pending application Ser. No. 11/067124, entitled Method and Apparatus for EUV Plasma Source Target Delivery, filed on the same day as the present application, the disclosure of which is also hereby incorporated by reference.

FIELD OF THE INVENTION

The present invention related to EUV light source generators using a plasma and specifically to methods and apparatus for delivery of a plasma source material to a plasma initiation site, which may be for a laser produced plasma or for a discharge produced plasma.

BACKGROUND OF THE INVENTION

It is known in the art to generate EUV light from the production of a plasma of an EUV source material which plasma may be created by a laser beam irradiating the target material at a plasma initiation site (i.e., Laser Produced Plasma, "LPP") or may be created by a discharge between electrodes forming a plasma, e.g., at a plasma focus or plasma pinch site (i.e., Discharge Produced Plasma "DPP") and with a target material delivered to such a site at the time of the discharge. Target delivery in the form of droplets of plasma source material, which may, e.g., be mass limited for better plasma generation conversion efficiency and lower debris formation, are known techniques for placing the plasma source material at the appropriate location and at the appropriate time for the formation of the plasma either by LPP or DPP. A number of problems are known to exist in the art regarding the delivery timing and positioning of the target at the plasma initiation site which are addressed in the present application.

Commercially available lithium has purity of 99.99% (100 ppm). A method of lithium purification is distillation as discussed in U.S. Pat. Nos. 4,738,716 and 4,842,254 at a temperature of, e.g., 550° C. for several hours (6 hours). This can decrease the concentrations from 200 ppm to 5 ppm for Na and from 100 ppm to 2 ppm for K. Both Na and K are condensed on a surface with temperature of 100° C.

SUMMARY OF THE INVENTION

An EUV target delivery system and method is disclosed which may comprise: a liquid target delivery system target material reservoir; a target material purification system connected to deliver liquid target material to the target material reservoir comprising: a first container and a second container in fluid contact with the target material reservoir; a filter intermediate the first chamber and the second chamber; a liquid target material agitation mechanism cooperatively associated with the second container an operative to rotate the liquid target material within the second container to remove surface film to agitate the liquid target material in the second container to prevent surface film from forming on the exposed surface of the liquid target material or remove surface film formed on the exposed surface of the liquid target material. The liquid target material agitation mechanism may comprise an electromagnetic or magnetic stirring mechanism at least partly positioned outside of the second container or within the second container, and may comprise a swirling mechanism positioned within the second container or a flopping mechanism positioned within the second container. The swirling mechanism or flopping mechanism may be driven by an electromagnetic or magnetic driver external to the second container. The filter may comprise a mechanism for removing impurities from the liquid target material such as liquid target material compounds of, e.g., $O_2$, $N_2$ and/or $H_2O$. The liquid target material agitation mechanism may comprise a moving magnetic field inducing rotational motion in the liquid target material due to the passage of a rotating magnetic field through the liquid target material. The EUV target delivery system may comprise a liquid target delivery system target material reservoir; an inert gas pressurizing unit applying pressure to the interior of the reservoir comprising an inert gas; and an inert gas purification system connected to deliver the inert gas to the liquid target material reservoir interior comprising: an inert gas supply container; at least one purification chamber containing the target material in a form reactive with impurities contained in the inert gas reacting with such impurities and removing from the inert gas the impurities in sufficient quantity that such impurities are substantially removed from the inert gas such that reactions between the target material and such impurities are substantially prevented from forming substantial amounts of target material-impurity compounds when the inert gas contacts the liquid target material in the liquid target material reservoir. The at lest one purification chamber may comprise a plurality of purification chambers. An EUV target delivery method may comprise: providing an evaporation chamber in fluid communication with an impurity chamber and with a target droplet mechanism liquid target material reservoir and containing liquid source material; heating the liquid source material to a first temperature sufficient to evaporate a first set of contaminants but not a second set of contaminants; heating the liquid source material to a second temperature sufficient to evaporate the liquid target material e.g., lithium and leave the second set of contaminants behind. The source material may comprise lithium or tin. The first contaminants may comprise materials from a group comprising Na and/or K. The second contaminants may comprise materials from a group comprising Fe, Si, Al, Ni.

DETAILED DESCRIPTION OF PREFERRED EMBODIMENTS

Figure 1:
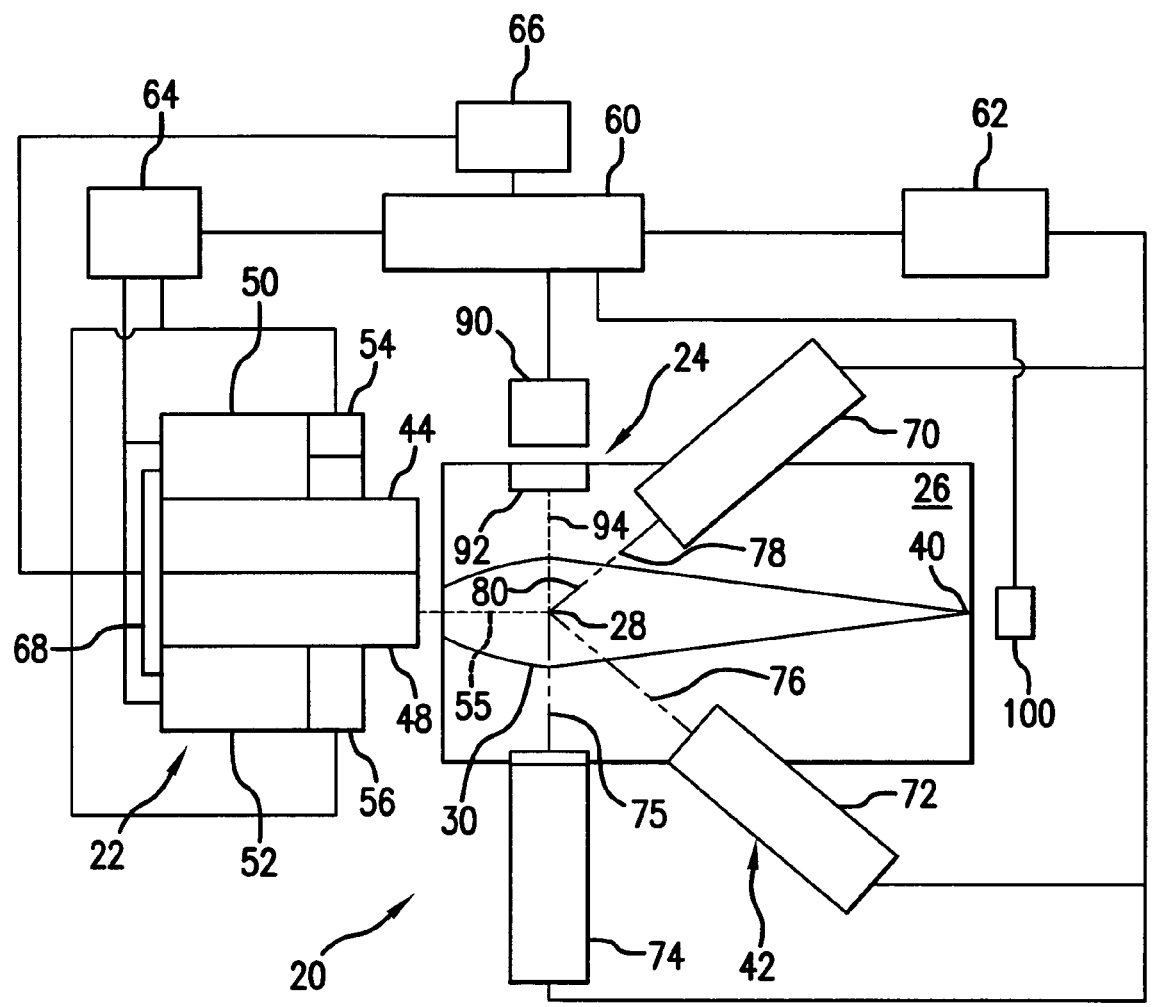
FIG. 1 shows schematically in block diagram form an LPP EUV light source according to aspects of an embodiment of the present invention.

Turning now to FIG. 1 there is shown a schematic view of an overall broad conception for an EUV light source, e.g., a laser produced plasma EUV light source 20 according to an aspect of the present invention. The light source 20 may contain a pulsed laser system 22, e.g., one or more gas discharge excimer or molecular fluorine lasers operating at high power and high pulse repetition rate and may be one or more MOPA configured laser systems, e.g., as shown in U.S. Pat. Nos. 6,625,191, 6,549,551, and 6,567,450. The light source 20 may also include a target delivery system 24, e.g., delivering targets in the form of liquid droplets, solid particles or solid particles contained within liquid droplets. The targets may be delivered by the target delivery system 24, e.g., into the interior of a chamber 26 to an irradiation site 28, otherwise known as an plasma formation site or the sight of the fire ball, i.e., where irradiation by the laser causes the plasma to form from the target material. Embodiments of the target delivery system 24 are described in more detail below.

Laser pulses delivered from the pulsed laser system 22 along a laser optical axis 55 (or plurality of axes, not shown in FIG. 1) through a window (not shown) in the chamber 26 to the irradiation site, suitably focused, as discussed in more detail below, and in above referenced co-pending applications, in coordination with the arrival of a target produced by the target delivery system 24 to create an EUV or soft-x-ray (e.g., at or about 13.5 nm) releasing plasma, having certain characteristics, including wavelength of the x-ray light produced, type and amount of debris released from the plasma during or after plasma initiation, according to the material of the target, the size and shape of the target, the focus of the laser beam and the timing and location of the laser beam and target at the plasma initiation site, etc.

The light source may also include a collector 30, e.g., a reflector, e.g., in the form of a truncated ellipse, with an aperture for the laser light to enter to the irradiation site 28.

Embodiments of the collector system are described in more detail below and in above referenced co-pending applications. The collector 30 may be, e.g., an elliptical mirror that has a first focus at the plasma initiation site 28 and a second focus at the so-called intermediate point 40 (also called the intermediate focus 40) where the EUV light is output from the light source and input to, e.g., an integrated circuit lithography tool (not shown). The system 20 may also include a target position detection system 42. The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 64, along with, e.g., a laser beam positioning system 66.

The target position detection system 42 may include a plurality of droplet imagers 70, 72 and 74 that provide input relative to the position of a target droplet, e.g., relative to the plasma initiation site, and provide these inputs to the target position detection feedback system, which can, e.g., compute a target position and trajectory, from which a target error can be computed, if not on a droplet by droplet basis then on average, which is then provided as an input to the system controller 60, which can, e.g., provide a laser position and direction correction signal, e.g., to the laser beam positioning system 66 that the laser beam positioning system can use, e.g., to control the position and direction of the laser position and direction changer 68, e.g., to change the focus point of the laser beam to a different ignition point 28. Input may also be provided to the target delivery system 24 to correct for positioning error of the targets, e.g., droplets of liquid plasma source material from the desired plasma initiation site, e.g., at one focus of the collector 30.

The imager 72 may, e.g., be aimed along an imaging line 75, e.g., aligned with a desired trajectory path of a target droplet 94 from the target delivery mechanism 92 to the desired plasma initiation site 28 and the imagers 74 and 76 may, e.g., be aimed along intersecting imaging lines 76 and 78 that intersect, e.g., alone the desired trajectory path at some point 80 along the path before the desired ignition site 28. other alternatives are discussed in above referenced co-pending applications.

The target delivery control system 90, in response to a signal from the system controller 60 may, e.g., modify, e.g., the release point and/or pointing direction of the target droplets 94 as released by the target delivery mechanism 92 to correct for errors in the target droplets arriving at the desired plasma initiation site 28.

An EUV light source detector 100 at or near the intermediate focus 40 may also provide feedback to the system controller 60 that can be, e.g., indicative of the errors in such things as the timing and focus of the laser pulses to properly intercept the target droplets in the right place and time for effective and efficient LPP EUV light production.

For EUV target delivery in the form of liquid droplets of the target material, e.g., liquid Sn or Li, or frozen droplets of Xe, or a suspension of target material in another liquid, e.g., water or alcohol or other liquid, or the like, it has been proposed in co-pending applications noted above to utilize piezoelectric drivers to, e.g., vibrate and or squeeze droplets from the end of a capillary, e.g., in the form of a nozzle. However, piezoelectric elements have operating limitations, e.g., temperature limits (e.g., not to exceed about 250° C.), which may not allow them to be utilized in the environment of delivering target droplets to a plasma initiation site, whether a DPP or LPP plasma initiation, e.g., due to the geometries involved. Another form of droplet generator droplet formation for the target delivery system according to aspects of an embodiment of the present invention may be seen in FIG. 2.

Figure 2:
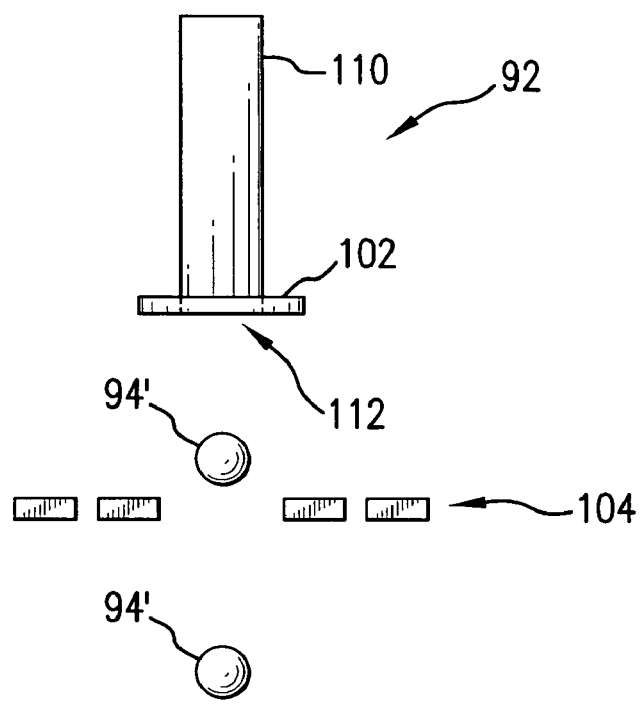
FIG. 2 shows schematically a target delivery mechanism according to aspects of an embodiment of the present invention.

Turning now to FIG. 2 there is shown schematically according to aspects of an embodiment of the present invention an electrostatic liquid target droplet formation/delivery mechanism which as proposed can, e.g., pull a droplet out of the target droplet delivery mechanism/system rather than and/or in addition to waiting for induced disturbances and viscosity to take over, e.g., in a stream produced from an output orifice of the target droplet delivery mechanism/system. In this manner, a series of droplets 94', e.g., may be influenced in their formation and/or speed, e.g., using a charged element, which may be, e.g., a generally flat conductive plate/grid 104 placed at a distance from the output orifice 112, e.g., at the terminus of an output nozzle 114 (shown, e.g., in FIG. 4A), at the end of a liquid target delivery capillary 110 passageway. An applied voltage, applied, e.g., between the nozzle and the plate/grid may then, at least in part, contribute to droplet 94' formation and/or acceleration intermediate the output orifice 112 and the charged element 104, or even perhaps beyond the plate/grid 104 in the target delivery path, and also perhaps involving turning off the voltage to allow the droplet to pass through a hole in the plate/grid 104.

Figure 5:
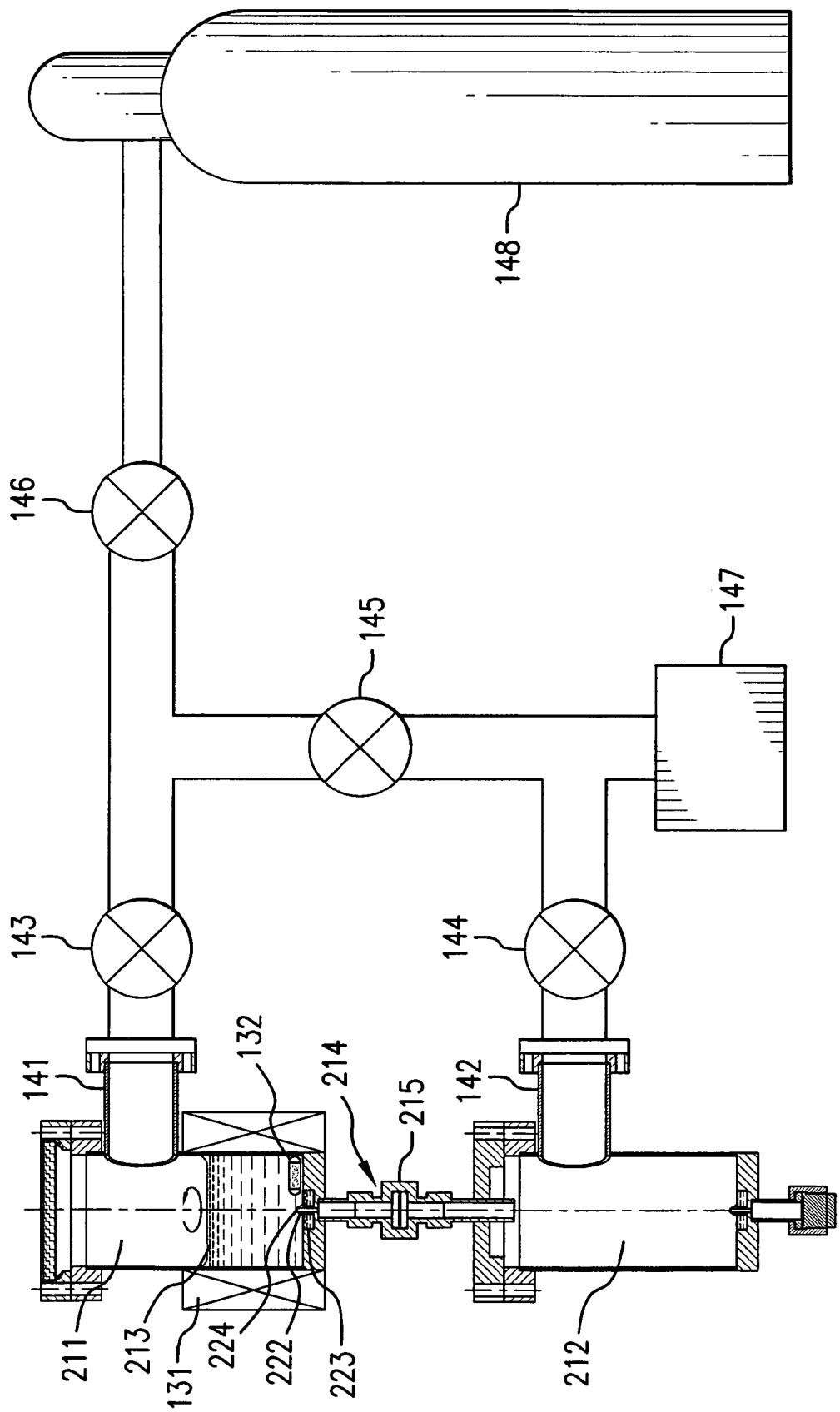
FIG. 5 shows schematically a target material supply mechanism according to aspects of an embodiment of the present invention.
Figure 8:
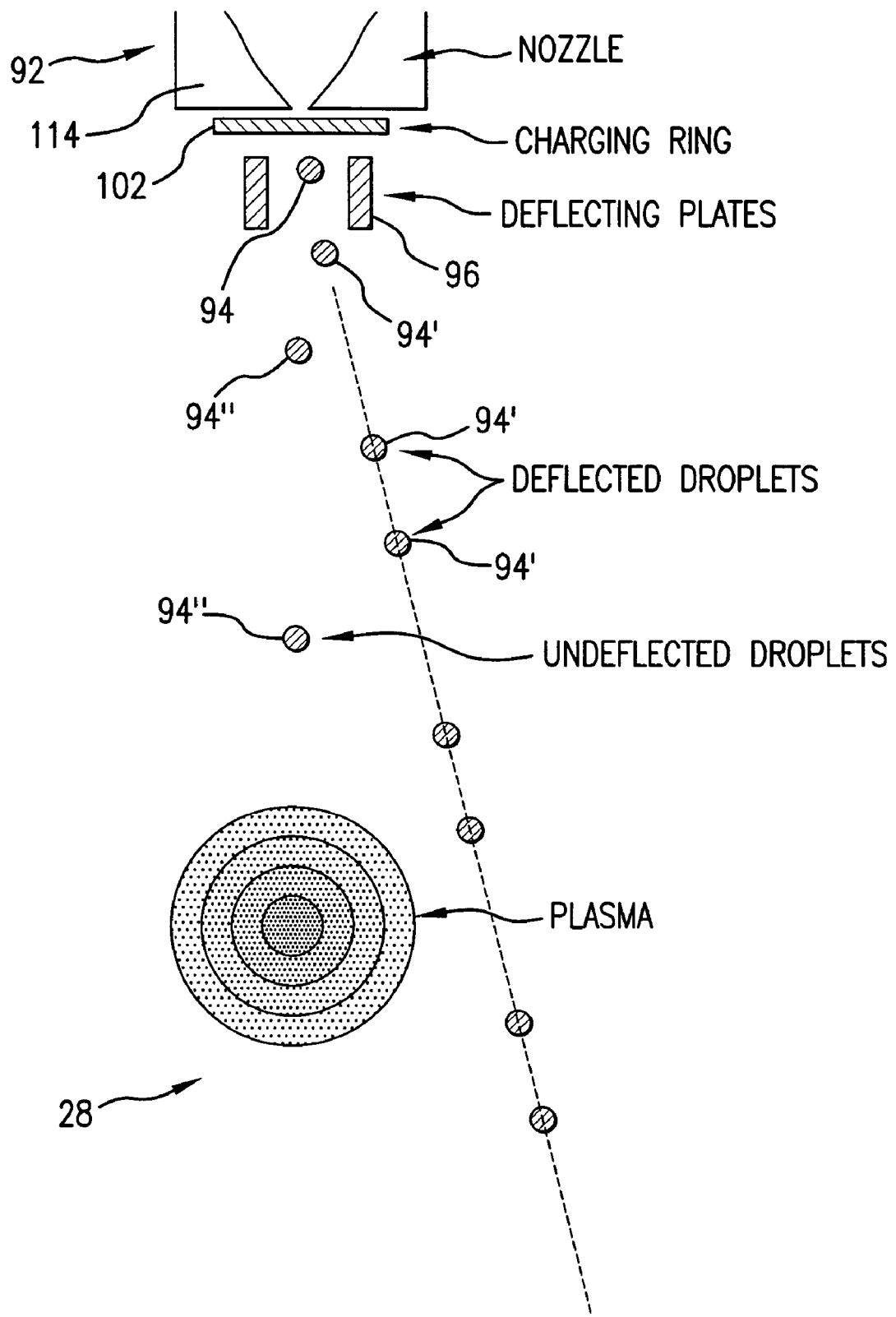
FIG. 8 shows schematically a target delivery mechanism according to aspects of an embodiment of the present invention.

According to aspects of an embodiment of the present invention an EUV light source target delivery system 92 as disclosed may comprise a target material in liquid form or contained within a liquid, which may include a liquid of the target material itself, e.g., tin or lithium, or target material contained within a liquid, e.g., in a suspension or dispersion, or a liquid target containing compound, e.g., $Si(CH_3)$, or the like, such that the physical properties of the liquid, such as surface tension and adhesion and viscosity, and, e.g., the properties of the environment, e.g., temperature and pressure and ambient atmosphere, will allow a stream of the particular liquid, exiting the output orifice 112 to spontaneously, or due in part, e.g., to some external influence, form into droplets 94' at some point after exiting the output orifice 112, including immediately upon so exiting or further down a target droplet delivery path to a plasma initiation site 28 (shown in FIG. 8). The liquid target droplet formation material may be stored in a target droplet material reservoir (e.g., 212 as illustrated in FIG. 5) and delivered to the output orifice 112, which may be, e.g., in a nozzle 114, through a target delivery capillary passage 110 intermediate the reservoir 212 and the output orifice 112. The system may also include a target material charging mechanism, e.g., a charging ring 102 positioned relative to the capillary 110 and orifice 112 to apply a charge to at least a portion of a flowing target material mass prior to leaving or as it is leaving the output orifice 112. According to aspects of an embodiment of the present invention an electrostatic droplet formation mechanism 92 thus may comprise a charged element 104 oppositely charged from the charge placed 104 on the target material and positioned to induce the target material to exit the output orifice and form a droplet 94' at the output orifice 112 or intermediate the output orifice 112 and the electrostatic charge plate 104.

To allow for higher temperature operation of a liquid droplet target droplet generator 92 as compared to conventional piezoelectric stimulation, applicants propose using magnetostriction (or electrostriction) to vibrate and/or squeeze the nozzle 110 in the target delivery assembly 92 instead of, e.g., using a piezo-actuated material, e.g., a piezo-crystal or piezoceramic element. This is advantageous from a temperature limit point of view since the Curie temperature for magnetostrictive (or electrostrictive) materials can be higher than for piezoelectric materials.

Such magnetostrictive (and/or electrostrictive) materials 122, 122', 122" have been determined by applicants to possess a high enough operating temperature, and frequency and strain characteristics, such that the required power can be supplied with a reasonable applied magnetic (or electric) field with the same or similar actuation forces as a piezoelectric material. According to aspects of an embodiment of the present invention illustrated in FIGS. 3, 4 and 4A, the specific geometry of the. e.g., magneto/electro-strictive material 122, 122', 122", the liquid reservoir (not shown in FIGS. 3, 4 and 4A) and the external field generated, e.g., by coil 124 for a magnetic field, and how the field is specifically generated and specifically modulated will be understood by those skilled in the art.

Figure 4A:
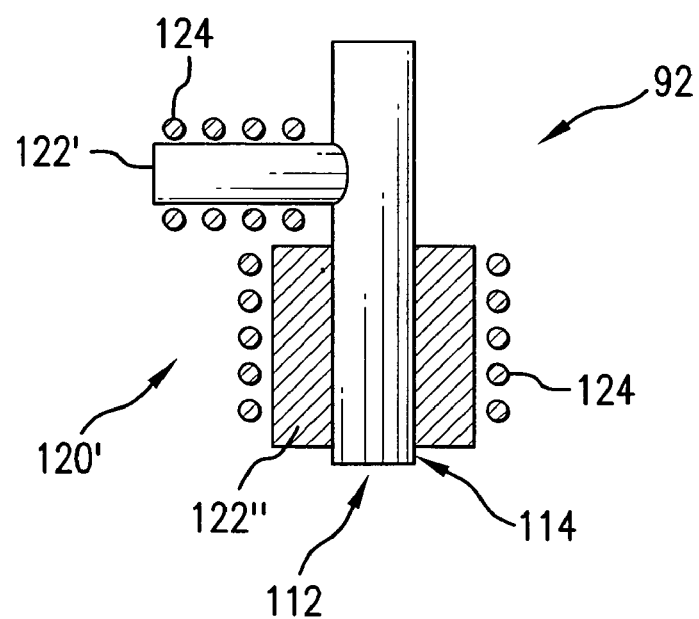
FIG. 4A shows schematically a target delivery mechanism according to aspects of an embodiment of the present invention.
Figure 3:
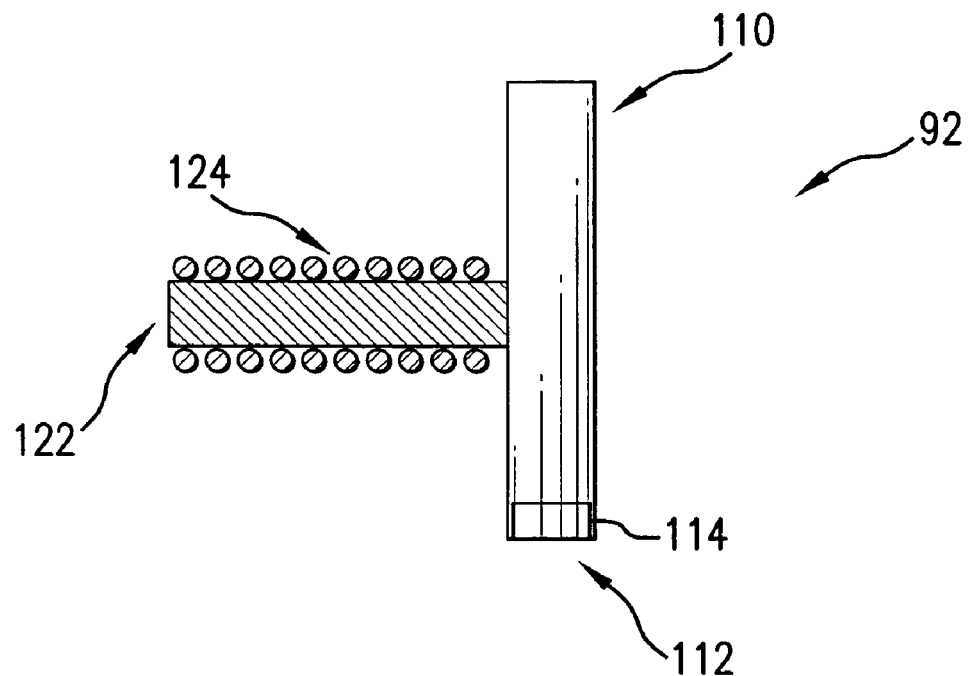
FIG. 3 shows schematically a target delivery mechanism according to aspects of an embodiment of the present invention.
Figure 4:
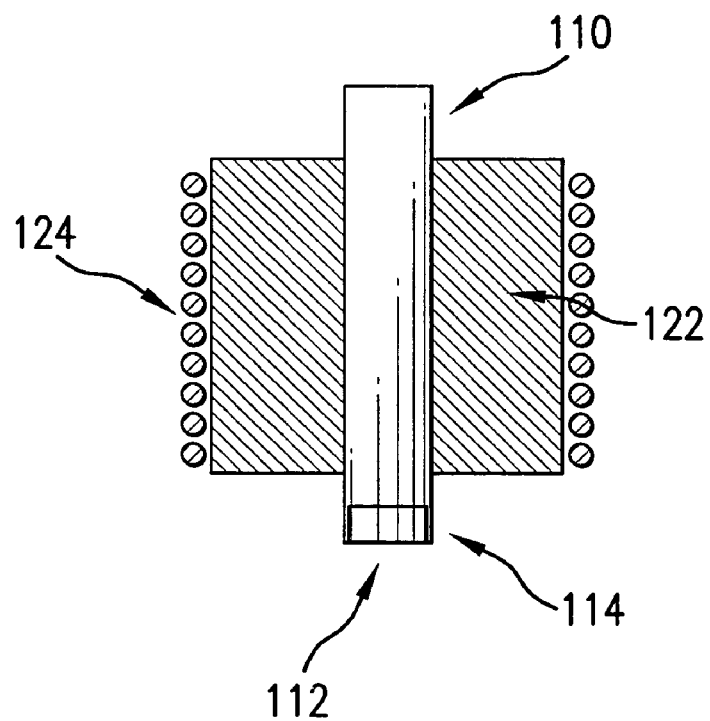
FIG. 4 shows schematically a target delivery mechanism according to aspects of an embodiment of the present invention.

Magnetostriction/Electrorestriction is a phenomenon where a material changes shape or size, e.g., is elongated, e.g., in one or more axes, by an external magnetic/electric field, much as a piezo electric material behaves when a voltage is applied across it. FIGS. 3, 4 and 4A show schematic illustrations of three possible examples of configurations in which such change of shape, e.g., elongation/contraction or thinning/thickening or both, may be utilized to stimulate droplet 94 formation, e.g., by coupling the energy into a capillary 110 terminating in a nozzle 114 with an output orifice 112. according to aspects of an embodiment of the present invention, depending on the applied waveform the target delivery mechanisms of FIGS. 3, 4 and 4A may, e.g., continuously modulate the stimulation to the capillary 110, e.g., with vibrational stimulation transverse to the longitudinal axis of the capillary 110, e.g., with other modulation to cause a jet stream emanating from the nozzle 112 to break up into a train of droplets 94 or alternatively to create an individual drop at the nozzle orifice 112, e.g., for a "droplet on demand" mode.

According to aspects of an embodiment of the present invention, FIG. 3 illustrates schematically an example of a side stimulation method and apparatus 120 where, e.g., a solid rod 122 of magnetostrictive material may be essentially bonded to the side of the droplet generator 92 capillary 110 and surrounded with a coil 124 to induce the required magnetic/electric field. A shield (not shown) may be employed, e.g., surrounding the assembly 92 to contain the magnetic/electric field. The details of coupling the force created by the elongation and contraction or vice-versa of the rod 122 against the side wall of the capillary 110 will be understood by those skilled in the art. This embodiment, in addition, may be seen to vibrate capillary 112 to cause and/or influence droplet formation, e.g., along with other droplet formation influences, e.g., pressure applied to the liquid target material.

According to aspects of an embodiment of the present invention an annular concept is illustrated schematically in FIG. 4, where, e.g., a cylindrical tube 122 of, e.g., magnetostrictive or electro-strictive material may be bonded around the droplet capillary 110. Here the thinning or thickening of the material 122 may be used, e.g., along with an initial bias employed to enable both negative and positive pressure on the capillary. The thickening or thinning of the material 122, i.e., expansion or contraction in a direction generally perpendicular to the capillary 110 longitudinal axis, followed by contraction/expansion may also be used. The resultant squeezing action on the capillary 110 normal to the longitudinal axis of the capillary 110 may serve, e.g., in combination with other droplet formation mechanisms, e.g., back pressure of the delivery of the liquid to the capillary 110, electrostatic droplet inducement, e.g., as discussed elsewhere in the present application, or the like, to modulate a stream of material exiting the nozzle orifice 112 to influence the timing, spacing, size, etc. of droplets forming in a stream of liquid exiting the nozzle 112. Similarly, the mechanism may cause or contribute to the inducement of a droplet to form and be forced out of the nozzle 112, e.g., in a "droplet on demand" mode of operation, along with, also, e.g., the timing, spacing, size, etc of the droplet on demand formed droplets. Here also a shield for the magnetic/electric field (not shown) may be employed.

According to aspects of an embodiment of the present invention FIG. 4A illustrates schematically the utilization of a horizontally mounted magneto-restrictive/electro-restrictive material 122' (as exemplified in FIG. 3) and a vertical/longitudinally mounted magneto-restrictive/electro-restrictive material 122" (as exemplified in FIG. 4) in combination. Such an embodiment may serve, e.g., to have the excitation of the actuator material 122' vibrate the capillary and the excitation of the actuator material 122" to squeeze and/or vibrate the capillary, with the selectively modulated combination of actuator influences on the droplet formation either by influencing an output jet or by originating droplets at the nozzle 112, e.g., for "droplet on demand" mode or alternatively or at the same time, one or the other of the actuator materials 122', 122" may be stimulated to at least in part influence the steering of the stream/droplets exiting from the nozzle 112 toward a plasma initiation site 28 in the EUV light source 20, which may also be the case for the embodiments illustrated schematically in FIGS. 3 and 4.

Liquid metal droplets and/or droplets of liquid with target material, such as metal in suspension or otherwise incorporated into the droplet are attractive as radiation source elements for a plasma generated or produced EUV light generation apparatus 20, including, e.g., lithium and tin. By way of example, such a source material, such as lithium, being supplied to the plasma initiation site 28 in the form of droplets of liquid lithium or a suspension of lithium in another liquid for the generation of droplets by jetting through the small diameter (from 10 to 100 micrometers) output orifice 112, e.g., at the end of a nozzle 114 as illustrated schematically in FIGS. 3, 4 and 4A. Of concern, however, can be contamination of plasma source material, e.g., liquid lithium by products of reaction of the plasma source material, e.g., with oxygen, nitrogen, water vapor etc. Such compounds are not soluble in liquid metal and can cause clogging of the nozzle orifice 112.

Applicants therefore propose according to aspects of an embodiment of the present invention a procedure for lithium cleaning for the removal of non-soluble compounds, which are either on the bottom of the supply vessel within, e.g., the molten plasma source material, e.g., lithium or on the surface of the nozzle 114 output orifice 112, e.g., due to high liquid plasma source material surface tension. This procedure may include, e.g., also certain proposed modifications. According to aspects of an embodiment of the present invention cleaning of a liquid plasma source material, e.g., lithium during loading into an EUV light source target droplet generator 92 can improve the reliability of the target droplet generator 92, in the delivery of, e.g., liquid lithium droplets 94.

Figure 6:
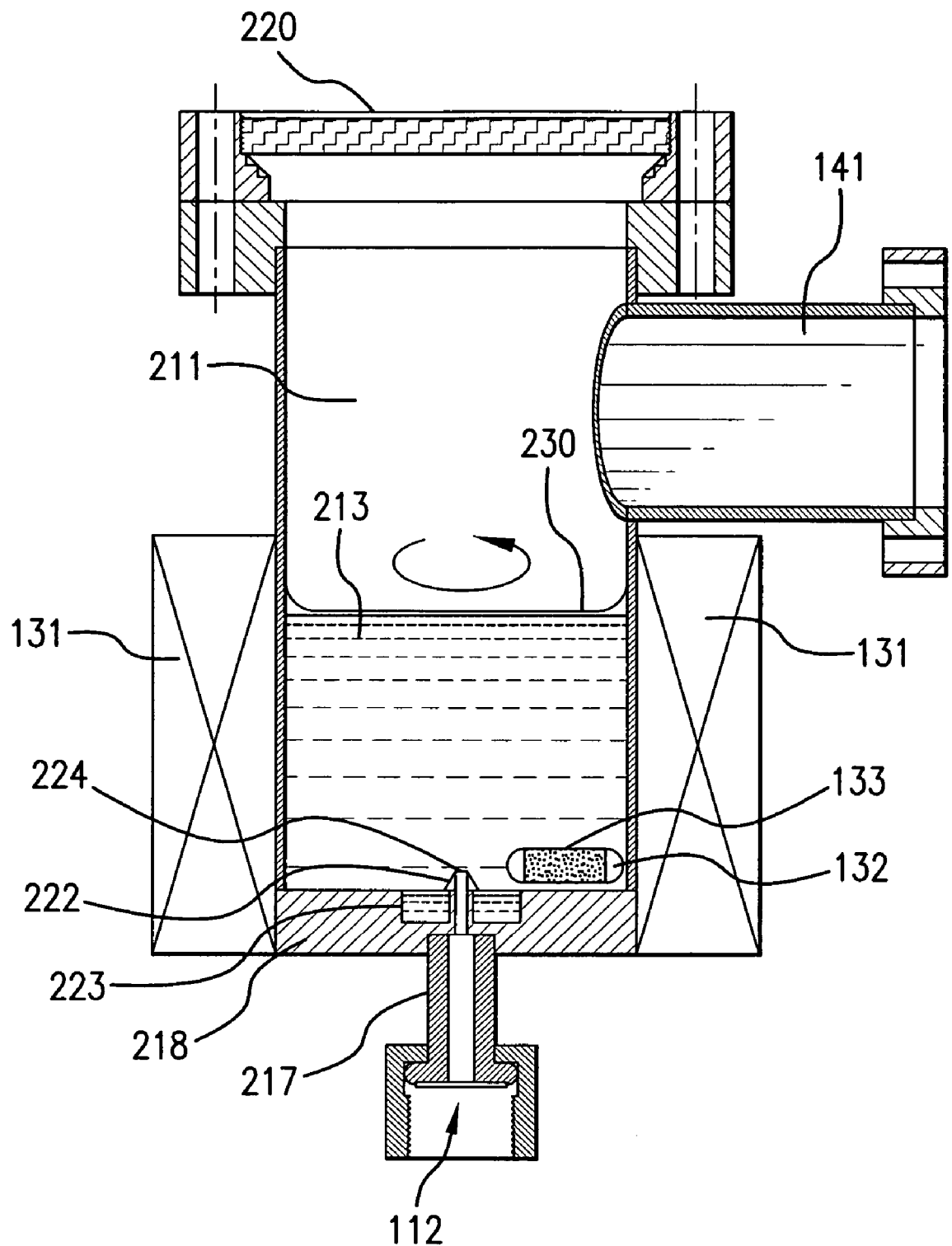
FIG. 6 shows schematically a more detailed view of a portion of the mechanism of FIG. 5.

Referring now to FIGS. 5 and 6, there is shown partly schematically and partly in cross section an apparatus and method for the cleaning of, e.g., non-soluble compounds of the liquid source material, e.g., metals, such as lithium and tin, e.g., with the liquid plasma source material flowing from a top container 211 to a bottom liquid target material supply cartridge 212 through a filter 214. The cartridge 212 may be part of the plasma source material droplet delivery system 92. The filter 214 may, e.g., use a mesh or sintered element 215 with filtering size much less than the diameter of the nozzle 114 output orifice 112, such as 0.5-7 μm for the mesh and 20-100 μm for the nozzle 114 output orifice 112. The containers 211, 212 may initially be back washed, e.g., at high temperature under pumping with turbo pump 147 using pumping ports 141, 142 and pumping valves 143, 144, 145, e.g., utilizing a purging gas, e.g., a noble gas like argon or helium, supplied from a purge gas supply 148 which, e.g., may be pressurized.

After inserting plasma source material into container 212, e.g., through a removable cover 220, and melting the plasma source material, e.g., lithium, to form a liquid plasma source material 213, e.g., as discussed elsewhere in the present application, the plasma source material may flow from container 211 into the cartridge 212, e.g., driven by pressure difference between the two vessels created by an inert gas (e.g. Ar, He) supplied to the container 211 from the gas bottle 148 through valves 146 and 143, with valve 145 shut. The liquid, e.g., lithium 213 can then flow through a small diameter orifice 224 at the bottom of the vessel 211. A nipple 222 surrounding the small diameter orifice 224 (diameter 1 μm or less) may be elevated from a bottom surface of the vessel 211 or from a counter bore 223 in the bottom of the vessel 211, and may have, e.g., a cone shape, e.g., as shown in FIG. 6. In this manner heavy compounds and metal chunks may be directed to the bottom surface of the vessel 211 and/or the counter bore 223, and therefore, kept from flowing through the orifice 224 in the vessel 211 and clogging the fine mesh filter element 215 in the filter 214.

In addition to gas pressure to move the liquid metal source materials pumping may be used, e.g., with an electromagnetic pump having mo mechanical moving parts that are commonly used for movement of such materials.

Molten source material, e.g., lithium, may have a non-soluble film 230 on its surface, due, e.g., to surface tension of differing densities or both. The film 230 may be composed of organic products and some non-soluble non-organic compounds, which remain on the surface due to high surface tension of the molten source material, e.g., lithium or tin. The film 230 may clog the fine filter 214 as well, e.g., if portions sink in the liquid 213 and enter the orifice 224, or the orifice 224 may simply become clogged. For minimization of such clogging or passage of the solid material of the surface film 230 through the bottom orifice 224, the orifice 224 diameter is made as small as possible (e.g., around 1 mm or so) with an appropriate driving pressure as will be understood by those skilled in the art. In this case most of film remains on the walls of the vessel due to action of surface tension.

According to aspects of an embodiment of the present invention to achieve an improvement in the removal of the surface film 230, the liquid plasma source material, e.g., lithium may be rotated in the container 211, e.g., with a stirring mechanism 132. As a result of such rotation of the stirring mechanism 132, centrifugal forces can be used to drive the surface film 230 to the side walls of the vessel 211, where it will adhere to the wall. Rotation can be produced by, e.g., one or more external coils 131 placed outside the container 211. An alternating current applied in appropriate phase to the coils 131 (similar to an AC induction motor) can be used to cause an alternating conductivity current through the molten lithium 213. The interaction of this current with the magnetic field of the coils 131 can be used to cause the rotation of the liquid metal 213.

In another approach, one or more a permanent magnets 133 can be placed into the liquid metal, e.g., within a shell 132, e.g., if more than one, attached to a ring (not shown) and spaced apart from each other. In this case the rotation (stirring) may be activated by external coils 131 as well. Magnets capable of withstanding the high operating temperature (up to 550° C.) are available as will be understood by those skilled in the art. The shell 132 may be made of a suitable material to protect the magnetic material from reacting with molten plasma source material.

Figure 9:
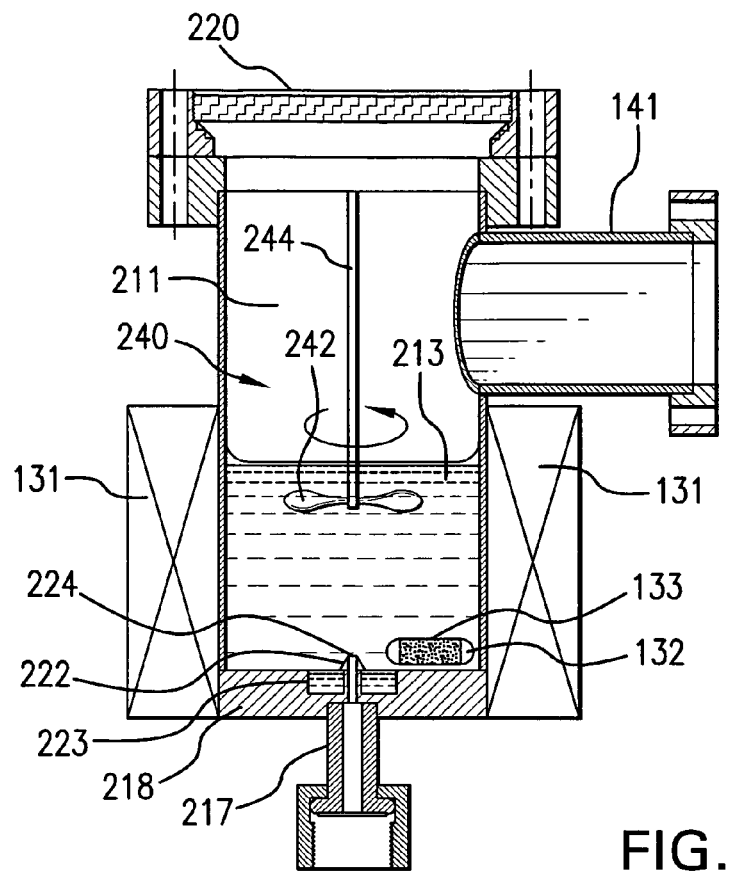
FIGS. 9 and 10 show alternate embodiments of the portion f the target delivery mechanism of FIG. 6 according to aspects of an embodiment of the present invention.
Figure 10:
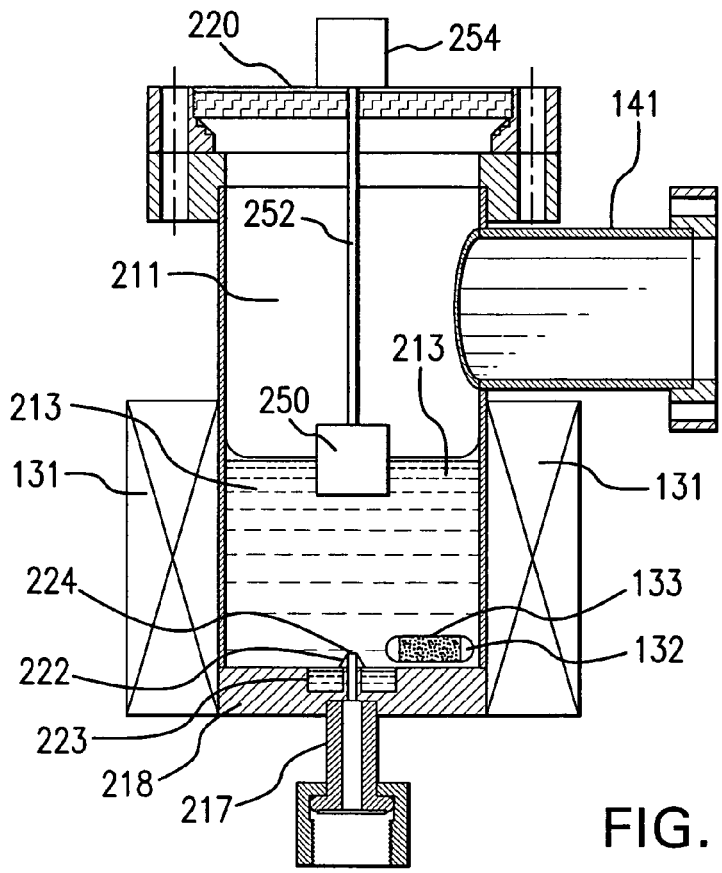

Turning now to FIGS. 9 and 10, there is illustrated partly schematically and partly in cross section alternative possible stirring elements 240 and 250, with the stirring element 240 comprising a propeller having blades 242 and rotatably mounted on a propeller shaft 244 suspended from a bracket (not shown) extending from the interior wall of the vessel 211 or integral with the removable top 220. The propeller 240 may be inductively rotated due to a rotating magnetic field set up by current passing through the coils 131 as discussed above. The stirrer 250 may comprise, e.g., a hollow cylinder 250 mounted on a shaft 252 and actuated, e.g., for up and down movement by a solenoid actuator 254 external to the vessel 211.

According to aspects of an embodiment of the present invention applicants propose to use the reactive plasma source material, e.g., lithium as a getter for cleaning a noble gas of compounds that may form harmful lithium compounds inside the EUV light source plasma generation chamber, before these compounds have a chance to get into the chamber or otherwise be exposed to the reactive plasma source material or system components that will later be exposed to the reactive plasma source material, e.g., lithium.

According to aspects of an embodiment of the present invention cleaning of noble gas (e.g. argon, helium) for application in an EUV light generator, e.g., with a liquid plasma target source material, e.g., based on Li or Sn as the radiating element can extend the lifetime of optical elements, e.g., the multilayer mirror and various windows, and also the reliability of the droplet generator. A noble gas such as argon, helium or other, may be used in a plasma produced EUV light generator, e.g., for vessel back flushing or droplet generation driving pressure application gases. If the plasma source material is a reactive one, e.g., lithium and to some extent tin, small contaminants of oxygen, nitrogen, water, organic vapors, etc., in the inert gas can lead to formation of, e.g., lithium-based compounds (e.g. lithium oxide, lithium nitride, lithium hydroxide). Such compounds may clog the nozzle 112 of the droplet generator 92 or deposit, e.g., on optical elements, e.g., mirrors and windows, and cause reflectivity/transmissivity degradation. Typically in high purity argon for example the supplier (e.g., Spectra Gases, Inc) can guarantee the concentration of contaminants will not be higher than some limit, e.g. 4 ppm of $N_2$, 0.5 ppm of $O_2$, and 0.5 ppm of $H_2O$.

A reactive plasma source material, e.g., lithium, can vigorously react with such impurities, e.g., contained within a noble gas and form stable compounds that may be hard to remove if deposited in unwanted locations, e.g., on EUV light generator chamber optics. At the same time, however, this high propensity for reaction with other materials may be used according to aspects of an embodiment of the present invention, illustrated for example in FIG. 7, partly schematically, to clean the noble gases by passing the gas through at least one vessel containing molten plasma source material, e.g., lithium or another material sufficiently reactive with one or more of such impurities. Lithium or such other liquid material or a combination of such materials each in different vessels, may, e.g., be held in vessels 262*a-b* forming an EUV light source generator noble gas cleaning apparatus 260 as seen illustratively in FIG. 6. The liquid reactive plasma source material, e.g., lithium, e.g., is held at a temperature of 200-300° C. in each of the vessels 252*a-d*. At this temperature the formed compounds of the reactive EUV plasma source material, e.g., lithium are stable and will remain in molten metal. On the other hand, the most of reactions (with $N_2$, $O_2$, $H_2O$) don't have activation energy, thus the reaction rate does not depend strongly on the temperature (there is, e.g., no exponential factor). In order, therefore, to provide a long enough time of interaction of gas flow with molten lithium, the lithium may be kept in a plurality of vessels 252*a-d* and the gas initiating from a gas flow inlet 254 bubbled through the liquid lithium in each successive vessel 252*a-d* by passing through an inlet pipe 270 into the bottom of the liquid 280 in the respective vessel 252*a-d* and removed from one vessel 252*a-c* and inserted into the next vessel 252*b-d* through a respective one of a plurality of gas transfers 256, to immerge from a gas flow outlet 258 substantially completely cleansed of compounds of the noble gas impurities and the reactive plasma source material, e.g., lithium. Thus the probability of such compounds being formed in regions of the plasma produced EUV light source machine subsequently exposed to the noble gas due to impurities introduced into the EUV system from the noble gas is substantially reduced or reduced to zero.

It will be understood that in the case, e.g., of Li, agitation will prevent flow of compounds of lithium through the center orifice due, e.g., to centrifugal force and/or wave action to the side walls of the container. The plasma target source material, e.g., lithium, having a lower specific gravity than any such compound, e.g., 0.5 g/cm³ will tend to stay toward the center of the container as the compounds move to the wall of the container, especially under centrifugal force. Such agitation may be utilized in any co9ntainer holding the target source material.

According to aspects of an embodiment of the present invention applicants propose a target delivery system 92 illustrated schematically in FIG. 8. As shown in FIG. 8, charge and deflection of target droplets 94 to reduce the number of droplets in the plasma region 28 of, e.g., an LPP EUV light source. As illustrated in FIG. 8, non-charged droplets 94" are sent to the plasma region 28, while charged droplets 94' are deflected away, e.g., by using charged deflection plates, e.g., charged with the same charge as the droplets 94'. Accordingly the system can minimize the effects of a charged plasma region and electric fields associated with the plasma region on charged droplets.

Figure 7:
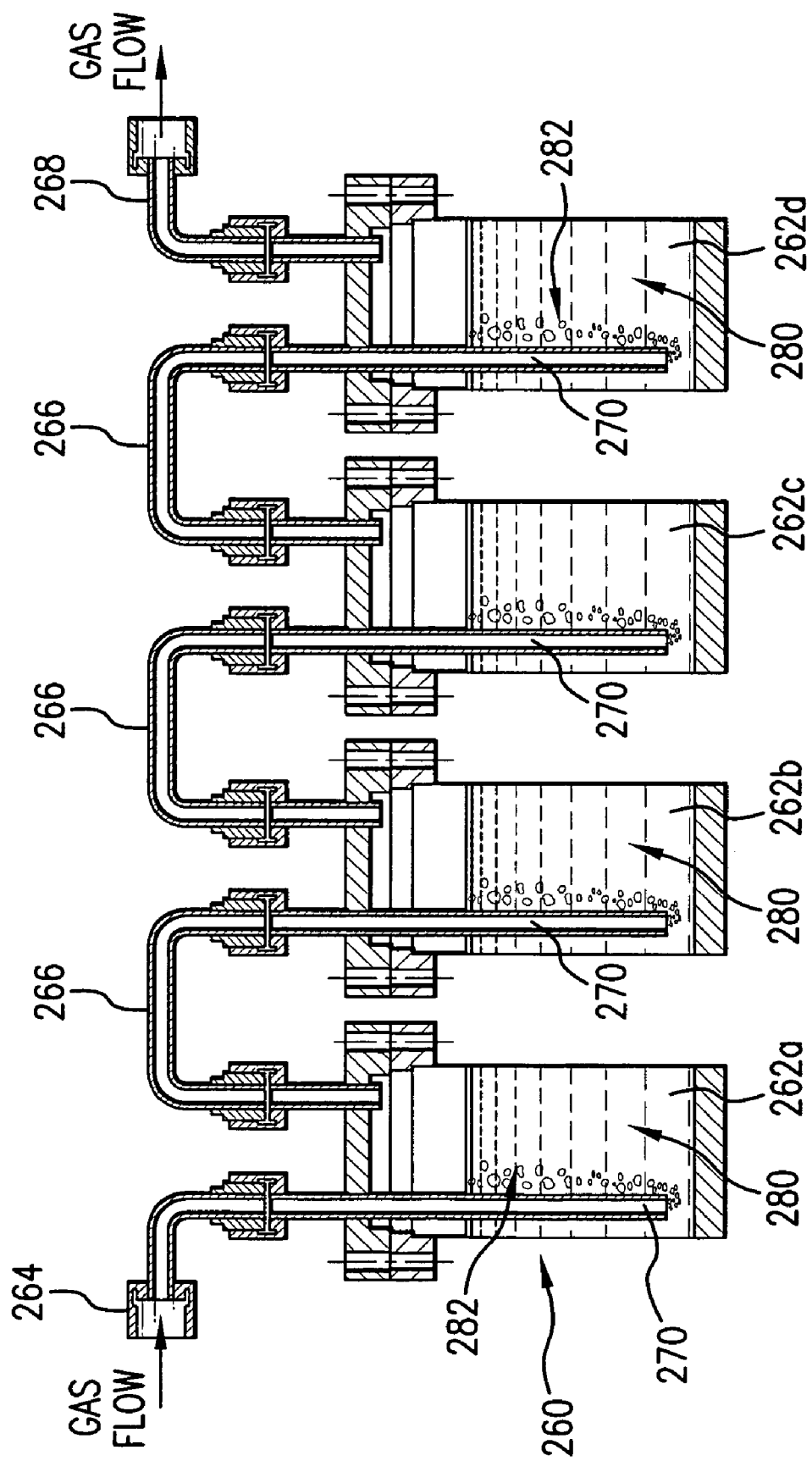
FIG. 7 shows schematically a portion of a target delivery system according to aspects of an embodiment of the present invention.

The charge and deflect concept according to aspects of an embodiment of the present invention contemplates also, e.g., deflecting the droplets 94' into the plasma region 28, and leaving uncharged droplets 94" to travel a separate path that does not go through the plasma region, as opposed to the embodiment illustrated in FIG. 7. In the embodiment of FIG. 8 the charged droplets 94' are deflected out of the plasma region 28 and the non-charged droplets 94" are hit by the drive laser to create the plasma at the plasma initiation site 28. In the embodiment of FIG. 7 the near zero charge on the targeted droplets 94" will interact less than the charged droplets would with the electrical fields that may be generated by the plasma in the plasma initiation site 28 or other elements, e.g., debris mitigation using, e.g., charged grids in the vicinity of the plasma initiation site 28, also as discussed in the present application. According to aspects of an embodiment of the present invention the charge deflection may be used with various plasma source materials capable of being charged, e.g., tin and lithium, compounds thereof and solutions/suspensions thereof.

According to aspects of an embodiment of the present invention, a jet of plasma source material streaming from the orifice 112 of the droplet formation nozzle 114, e.g., in an embodiment where the droplets form from a stream exiting the nozzle orifice 112, is charged right before the break off point where the droplets begin to form as is known in the art. The stream (not shown) may be charged, e.g., by a charging ring or plate 102, so that droplets 94 form charged droplets 94' or uncharged droplets 94" as they break off from the stream. In such a case, lengths of the stream may be charged or not charged by modulating the voltage applied to the charging plate 102, to achieve the desired selection in the droplets breaking out from the stream (not shown) into a certain number of uncharged droplets dispersed between charged droplets or vice-versa. Alternatively, e.g., in a droplet-on-demand mode as discussed above the charge plate may be modulated in timing with individual drop production. Subsequently, therefore, those of the droplets 94 constituting, e.g., charged droplets 94" as the charged drops 94" pass the deflecting plates 96, they can be steered away from the plasma initiation site 28 and those of the droplets 94 that are uncharged droplets 94' are not steered from their path and are struck by the drive laser at the plasma initiation site. Alternatively, the drops 94" may be steered onto the path to the target initiation site and the un-steered droplets remain on a trajectory that takes them away from the target initiation site.

In this manner, if, e.g., the droplet generator for a certain size of droplet has a droplet frequency and spacing that is not desired, some droplets can be so steered (or unsteered) to travel sufficiently far away from the plasma ignition site so as to, e.g., not interfere with and/or confuse metrology units, e.g., target tracking and laser firing timing metrology, by, e.g., being erroneously tracked as target droplets when they are not intended to be target droplets, and/or not to create additional debris by being scattered by the effects of plasma formation in actual target droplets due to being in close enough proximity at the time of plasma initiation to be sol influenced by the plasma as it is formed.

Liquid metal droplet generators usable for EUV plasma source liquid target material delivery based on PZT actuators for droplet stimulation, e.g., in both continuous and Drop-on-Demand ("DoD") mode and their potential shortcomings, have been discussed elsewhere in the present application. The PZT may be is attached to, e.g., a capillary conducting the liquid metal flow to an output nozzle and its output orifice. The operating temperature of the device can be limited by the used such materials as PZT and even glues and the like which are used for creating the mechanical assembly, e.g., with the PZT in contact with the capillary and/or nozzle and may, e.g., not exceed, e.g., about 250 degrees C. This can complicate thermal management of liquid metal plasma source materials, e.g., Sn or Li droplet generation, because the maximum operating temperature is close to the freezing temperature of the metals (231° C. for Sn and 181° C. for Li).

Figure 11:
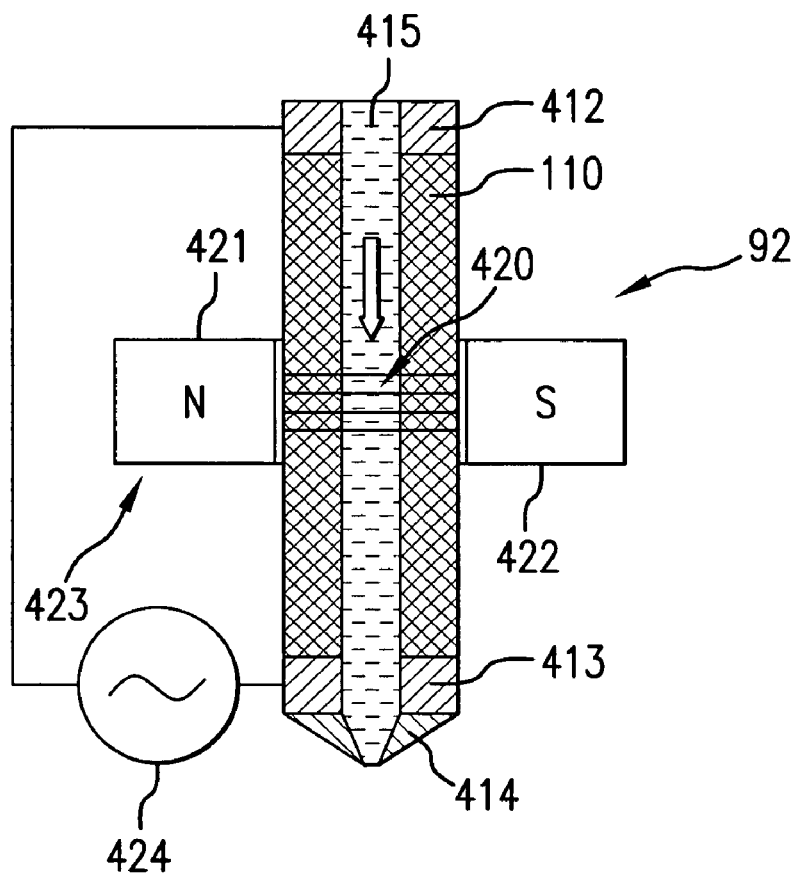
FIG. 11 shows schematically a target delivery mechanism according to aspect of an embodiment of the present invention.

Applicants, according to aspects of an embodiment of the present invention propose certain solutions to the foregoing including, e.g., an embodiment of the present invention illustrated partly schematically in FIG. 11. Turning to FIG. 11 there is illustrated, e.g., a mechanism that can result in, e.g., the improvement of the reliability, stability, and life-time of an droplet generator for a liquid metal EUV generating plasma source. With increasing possible high operating temperatures, e.g., of a continuous droplet generator, e.g., with temperatures exceeding significantly the freezing temperature of liquid metals which are used as plasma source liquid droplet materials applicants have proposed, based on, e.g., providing a stimulated droplet jet with stable droplet diameter and separation between the droplets can be generated by applying a periodic disturbing force to the liquid plasma source material liquid to, e.g., develop and/or contribute and/or modulate or assist in the modulation of the flow jetting through the nozzle.

The frequency of the disturbing force according to aspects of an embodiment of the present invention may be, e.g., close to the average spontaneous frequency of the droplet formation defined, e.g., as (in the first approximation) a function of the jet velocity and nozzle orifice diameter, e.g., (f=velocity/(4.5*diameter)). The constant in this formula may be varied, e.g., between about 4-6 either naturally of by intervention to vary the spontaneous frequency. Applicants propose, as illustrated schematically in FIG. 11, that a disturbance can be produced by, e.g., the interaction of a current passing through the conducting liquid plasma source metal 415 flowing through the thin capillary 110 with the external magnetic field applied to the capillary 110. FIG. 11 shows, as an example of such a droplet generating device 92, for stimulation of the liquid metal jet (not shown) by action of magnetic force. In this example an external permanent magnetic field 420 may be created by an electromagnet 423 with two poles (421, 422). The liquid metal 415 may then be induced to flow through a capillary 110, which may comprise with dielectric walls (for example, made of a suitable ceramic, such as $Al_2O_3$ or Al or AlN.

An alternating voltage from an AC voltage generator 424 may then be applied to two electrodes 412, 413 contacting with the liquid metal 415 jetting through the nozzle 414, which may also be made of a suitable dielectric or metal, or may be insulated from the electrode 413 and some part or all may be separately charged, as discussed elsewhere in the present application.

All the employed materials may be selected to, e.g., have operating temperatures much higher than freezing temperature of Sn or Li, as applicable.

Alternatively, according to aspects of an embodiment of the present invention the device 92 of FIG. 11 may comprise the current through the liquid metal 215 being DC or pulsed DC, and the external magnetic field may be alternating and if the current is pulsed DC, in appropriate phase and/or appropriately modulated to induce flow with magnetic disturbance (induced EMF force) when the DC voltage is pulse, or further alternatively both current and magnetic field may be alternating in the appropriate phases, as will be understood by those skilled in the art.

For example, according to Ampere's law, the force acting on the current is B*L*I, where B—is magnetic flux density (in Tesla), L—length of the magnetic field zone interacting with the current I, assuming by way of example that magnetic field lines are perpendicular to the current and the magnetic field is uniform across the length L. The disturbing force will then be perpendicular to both magnetic field and current. The exemplary equivalent pressure can be determined as the ratio of the force to the area of the capillary wall (3.14*r*L) corresponding to the interaction zone. The exemplary equivalent disturbing pressure may thus be equal to (B*I)/(3.14*r). For a capillary 110 with the diameter of 1 mm, B=0.5 T and I=1 A, the equivalent pressure will be ≈320 Pa.

The applied current may be selected, e.g., to not cause any problems with the thermal management of the device 92, which may occur, e.g., because of resistive heating of the liquid metal 215. With an exemplary channel diameter of, e.g., 1 mm and length of 1 cm the resistance of liquid Li or Sn will be on the order of about 1 mOhm; thus the heating power cam be as low as 1 mW. According, inducing electromotive force in the target liquid plasma source material with orthogonal electrical and magnetic fluxes either or both of which may be modulated to induce electromotive forces in the liquid can be used to force the liquid plasma source material out of the droplet generator orifice, in steady jet stream (constant predetermined droplet generation frequency, or droplet on demand ("DoD") modes of operation, and/or used in conjunction with other droplet generation force producing arrangements, discussed in the present application, e.g., applied pressure to the liquid plasma source material, capillary manipulation and/or squeezing, and the like as will be understood by those skilled in the art.

Figure 12:
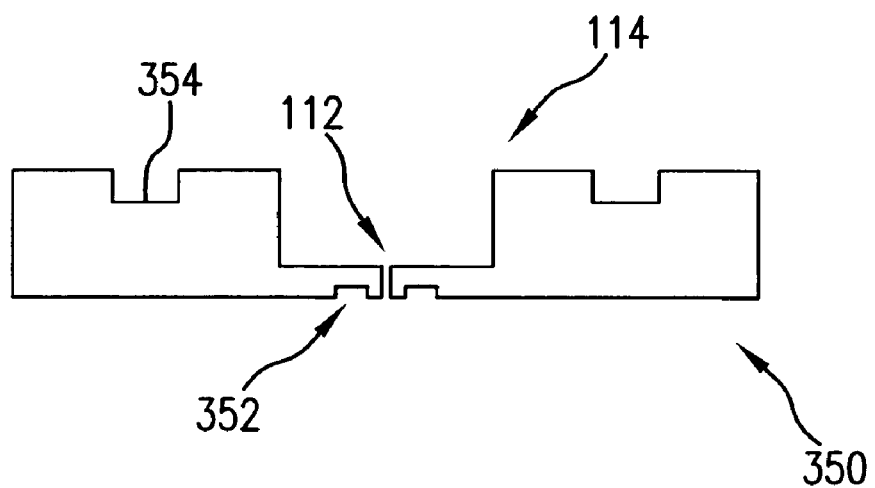
FIG. 12 shows schematically a target delivery mechanism according to aspects of an embodiment of the present invention.

Turning now to FIG. 12, there is shown a wetting barrier according to aspects of an embodiment of the present invention. In jetting liquid metal through, e.g., a pinhole nozzles applicants have found that wetting of the front side surface around the nozzle is a significant problem. According to aspects of an embodiment of the present invention, applicants propose to make a wetting barrier around the nozzle orifice, whereby, even if the wetting cannot be entirely eliminated it can be controlled. Although certain materials will greatly reduce the wetting of the front side surface applicants believe that the presence of the debris generating plasma in close proximity to the orifice can eventually coat it and promote wetting over time independent of material selected for the orifice and its surroundings. Applicants have found that wetting in itself is not the major problem but irregular and inconsistent wetting is, as this can, e.g., cause instability in the droplet forming, e.g., instability in the droplet forming emitted jet of liquid target material leaving the orifice. Additionally, e.g., after some off time wetting may form a blockage to the jet leaving the orifice According to aspects of an embodiment of the present invention as illustrated in FIG. 12, applicants propose a wetting barrier associated with a liquid source material output to control the wetting by controlling the wetting angle that a droplet makes with the surfaces surrounding the nozzle 114 orifice 112, e.g., with an annulus around the orifice 112, which may be a circular annulus 352. Accordingly, when the droplet material, e.g., molten lithium, wets, i.e., adheres to the surfaces around the orifice and spreads outwardly such an adhering region of the droplet, the groove 352 will modify the wetting angle between the portion of the droplet material still assuming the droplet surface shape and the surface adjacent to this surface shape such that wetting is stopped, as will be understood by those skilled in the art.

This can also allow better start/stop capabilities of the jet as this is also currently limited by excessive wetting after which the jet can not be started as the surface tension from the large wetted area is too great for the jet to overcome.

It will be understood by those skilled in the art that annulus in this regard may cover more than a completely encircling ring, e.g., a series of curved slots forming arcs of a ring and spaced from each other and from the orifice 112, such that the wetting of the droplet is sufficiently arrested over enough of the circumference of the wetting interface between the droplet and the surface surrounding the orifice to arrest the continuing expansion of the wetting circumference and the continuing expansion of the wetting itself.

Further, the "annulus" wetting barrier may be a geometric structure, e.g., a rectangle, oval, triangle, etc. other than an annular groove, around the periphery of the orifice such that the wetting circumference growth is arrested sufficiently to prevent wetting expansion of a droplet that results in the undesirable effects of wetting noted above for example. In this context then the wetting barrier, of whatever geometry, may surround the orifice completely and unbrokenly or may surround the orifice but in a broken non-complete peripheral structure around the orifice, as noted above.

According to aspects of an embodiment of the present invention a source material, e.g., tin or lithium, as an EUV source should have a concentration of contaminants less than about 1 ppm to meet the requirements of acceptable degradation rate for reflectivity of multiplayer mirror due to deposition of the contaminants, e.g., in the form of lithium compounds or compounds of the contaminants with other materials in the plasma formation chamber. At about 550° C. the prior art purification methods of purifying lithium from, e.g., Na or K work since the Na and K have higher vapor pressure than Li and evaporate from the liquid lithium. According to aspects of an embodiment of the present invention the method can be extended for purifying the plasma source material from other materials (Fe, Si, Al, Ni) by evaporation of the plasma source material at a definite temperature and specifically for use in a liquid target material target delivery system. This can significantly impact the useable lifetime of optical elements in the plasma formation chamber exposed to debris from the plasma formations in the form, e.g., of source material compounds including impurity elements.

Figure 13:
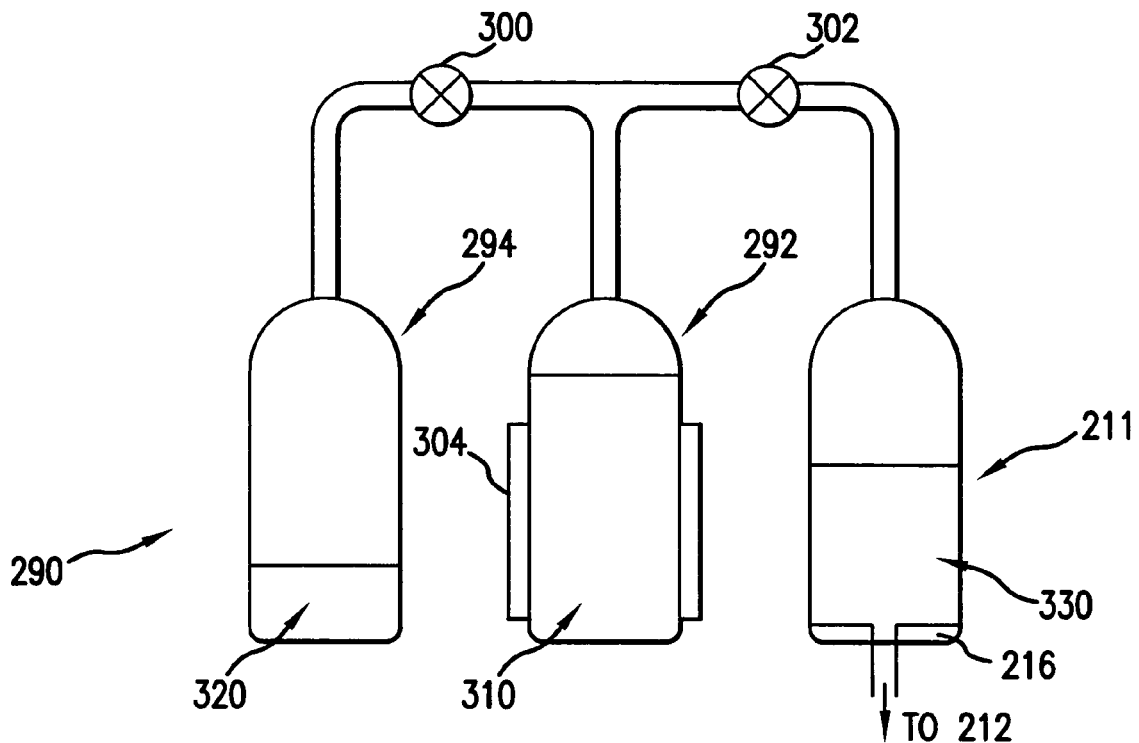
FIG. 13 shows schematically a portion of a target delivery mechanism according to aspects of an embodiment of the present invention.

According to aspects of an embodiment of the present invention illustrated schematically in FIG. 13, applicants propose to use the fact that the vapor pressure dependence on temperature of pertinent impurities shows that at a temperature in the range from 700 to 900° C. the evaporation rate of lithium exceeds that of such impurities as Al, Fe, Si, and Ni by more than 6 orders of magnitude. The lithium evaporation rate is high enough to provide the lithium consumption rate required for the EUV source. Thus, for lithium purifying the distillation in a purification system 290 may, e.g., be made in two stages. In the first stage the evaporation of Na and K occurs at a temperature of 550-600° C. maintained in a vessel 292 containing liquid plasma source material 310 such as lithium and heated by a heating coil or blanket 304. After accomplishing this stage of the distillation, and with valve 300 opened and valve 302 shut, a second vessel 294 the vessel 294 with condensed Na, K and Li in it may be sealed from the Li container 292 by shutting valve 300. At the second stage, the vessel 292 may be, e.g., heated up to 700-900° C. and the liquid plasma source material, e.g., lithium may be intensively evaporated and transported into another part of the system, e.g., the source material reservoir 211 discussed above in regard to FIGS. 5 and 6, in the target droplet delivery system 92, for further use (e.g. in producing target droplets in the droplet generator). The temperature range during the second evaporation, according to aspects of an embodiment of the present invention may be restricted to some selected upper limit, e.g., 800° C., in order to, e.g., prevent melting and decomposition of a desired material, e.g., lithium nitride, such that, e.g., the source material, e.g., lithium may be purified from nitrogen as well. The distillation method just described may be used for material transporting, e.g., in lithium supply systems, e.g., operating in ultra-clean conditions required for long-life time of EUV optical components within the plasma formation chamber, e.g., the multilayer mirror ("MLM").

According to aspects of an embodiment of the present invention applicants have found that in the operation of a currently proposed liquid metal droplet generator there is a need for closed loop feedback and control to maintain droplet stability over extended periods of time. Applicants propose a closed loop control system to maintain stable droplet operation, e.g., at a fixed frequency of droplet formation and a selected droplet spacing. For a certain frequency and orifice size, stable droplet operation requires a specific droplet fluid exit speed from the nozzle orifice, e.g., around 4.5*jetdiameter*frequency. Also there is a relationship between applied pressure and the resultant speed. However, as the system ages pressure losses and size differences could occur that will require the pressure to change in order to maintain stable operation. Applicants propose according to aspects of an embodiment of the present invention a system to control pressure to maintain optimal stability at a given frequency.

Figure 14:
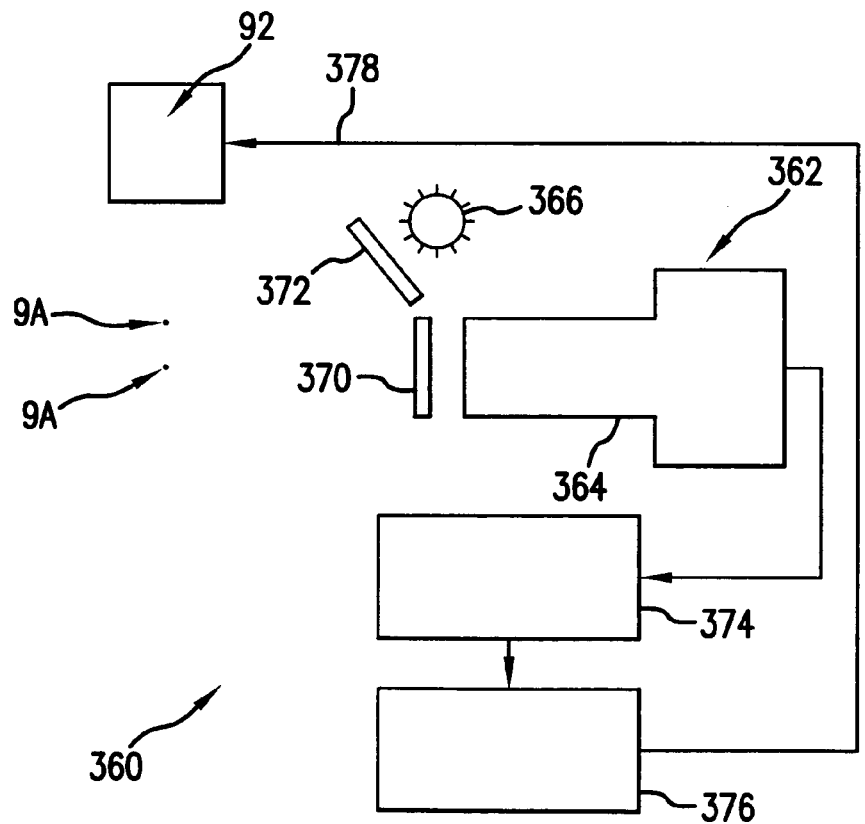
FIG. 14 shows schematically a portion of a target delivery mechanism according to aspects of an embodiment of the present invention.

Turning to FIG. 14 there is shown schematically a droplet stability system 360 according to aspects of an embodiment of the present invention. A short exposure time imaging system 362, which can be selected, e.g., to minimize blurring of the images of the moving target droplets 94, may be used, e.g., to continuously obtain images of the droplet 94 stream and based on these images calculate droplet 94 size and spacing.

Given a fixed frequency and no change in size the pressure may then be controlled to maintain an optimal spacing, compensating for any changes in filter losses etc which change the system so that the pressure at the output orifice varies for a given applied pressure back upstream. If a small change in size occurs, e.g., due to a change in the diameter of the jet, the pressure may changed, e.g., to maintain the correct spacing given the new jet diameter.

The imaging system 362 may comprise, e.g., a high speed camera 364, or strobing with a flashing strobe light at some high speed strobing frequency during a short period of time, to image the droplets 94 with sufficient speed, either at the droplet frequency or periodically enough to get an average or periodic sample that can be analyzed by an image processor 374, which may comprise an image processor able to produce information relating to the relative size and positioning of droplets including spacing either on a droplet by droplet basis or strobed to selects some but not all droplets having the characteristics. the processor in combination with the imaging apparatus may also provide spatial positioning information regarding the imaged droplets, e.g., in relation to some point in space, e.g., a desired plasma initiation site. The field of the image may, e.g., be of sufficient size to include at least two successive droplets or the equivalent useful for determining droplet size and spacing, which information may be fed to a controller 376, which may comprise a suitable programmed microprocessor or microcontroller, that is programmed to provide, e.g., a control signal, e.g., a pressure control signal 370 to the droplet generator 92.

Those of ordinary skill in the art will understand that according to aspects of an embodiment of the present invention applicants contemplate an EUV liquid target delivery mechanism/system wherein, e.g., an electrostatic liquid target droplet formation mechanism can, e.g., pull a droplet out of a target droplet delivery mechanism/system rather than and/or in addition to waiting for induced disturbances and viscosity to take over, e.g., in a stream produced from an output orifice of the target droplet delivery mechanism/system. In this manner, a series of droplets, e.g., may be influenced in their formation and/or speed, e.g., using a charged element, which may be, e.g., a generally flat conductive plate/grid placed at a distance from the output orifice, e.g., a nozzle, at the end of a liquid target delivery capillary passageway. An applied voltage, applied, e.g., between the nozzle and the plate/grid may then, at least in part contribute to droplet formation and/or acceleration intermediate the output orifice and the charged element, or even perhaps beyond the plate/grid in the target delivery path, and also perhaps involving turning off the voltage to allow the droplet to pass through a hole in the plate/grid.

According to aspects of an embodiment of the present invention an EUV light source target delivery system as disclosed may comprise a target material in liquid form or contained within a liquid, which may include as noted above a liquid of the target material itself, e.g., tin of lithium, or target material contained within a liquid, e.g., in a suspension, dispersion or solution, such that the physical properties of the liquid, such as surface tension and adhesion and viscosity, and, e.g., the properties of the environment, e.g., temperature and pressure and ambient atmosphere, will allow a stream of the particular liquid, exiting the output orifice to spontaneously or due to some external influence form into droplets at some point after exiting the output orifice, including immediately upon so exiting or further down a target droplet delivery path to a plasma initiation site. The liquid target droplet formation material may be stored in a target droplet material reservoir and delivered to the output orifice, which may be, e.g., a nozzle, through a target delivery capillary passage intermediate the reservoir and the output orifice. The system may also include a target material charging mechanism positioned relative to the capillary and orifice to apply a charge to at least a portion of a flowing target material mass prior to leaving or as it is leaving the output orifice. According to aspects of an embodiment of the present invention an electrostatic droplet formation mechanism comprising a charged element oppositely charged from the charge placed on the target material and positioned to induce the target material to exit the output orifice and form a droplet at the output orifice or intermediate the output orifice and the electrostatic droplet formation mechanism.

According to aspects of an embodiment of the present invention a pressurizing mechanism upstream of the output orifice may applying pressure to the target material forcing the target material out of the output orifice in a variety of ways, which those skilled in the art will understand and some of which are discussed in the present application. Also the pressurizing mechanism may comprise a pressure modulator varying the pressure applied to the target material liquid. This may, e.g., be done in response to EUV light source system feedback control, e.g., to increase or decrease the speed of the droplets in a series of target droplets arriving at the plasma initiation site, or to control, e.g., the timing of the droplets emerging from the target delivery system output orifice, e.g., for a droplet on demand ("DoD").

The pressurizing mechanism may also comprise a relatively constant pressure to the target material liquid. Those skilled in the art will understand that constant as used her means within the bounds of a control system to regulate the pressure and may vary as the control system determines over time or =for other operational reasons, and does not imply a single fixed pressure that is always selected to be maintained and never varied from the selected setting.

Also according to aspects of an embodiment of the present invention a target droplet deflecting mechanism may be included which may comprise at least one deflecting mechanism plate associated with forming an electrical field transverse to a target droplet path intermediate the output orifice and the charged element deflecting selected target droplets from the desired target droplet path. The pressure applied to the target droplet liquid may comprise sufficient pressure to form droplets in the stream of liquid target material exiting the output orifice and also to deliver a target droplet formed from the target droplet liquid, either upon exiting from the output orifice or formed from the breakup of a stream of liquid exiting the output orifice, to a plasma initiation site; and the electrostatic droplet formation mechanism at least in part may control the speed of the target droplet intermediate the output orifice and the plasma initiation site. Alternatively, e.g., the pressure applied to the target droplet material may comprise sufficient pressure to cause the target material to exit the output orifice either as droplets or a stream that breaks up into droplets, as those skilled in the art will understand but not to form droplets that will reach the plasma initiation site; and the electrostatic droplet formation mechanism at least in part controls the formation of a target droplet and/or the speed of the target droplet intermediate the output orifice and the plasma initiation site. Those skilled in the art will understand that such pressure may be sufficient, e.g., to allow the liquid to break out from the output orifice, overcoming, e.g., surface tension of the liquid across the output orifice, and the electrostatic droplet formation mechanism may then take over to assisting in both droplet formation and acceleration or the droplets may form spontaneously or under external influence other than the electrostatic droplet formation mechanism charged plate/grid, without sufficient velocity to reach the plasma initiation site and/or to so reach the site at the proper time, and the acceleration from the plate/grid charge takes over control of the droplet reaching the desired plasma formation site. Similarly the pressure applied to the target droplet material may comprise sufficient pressure to cause the target material to exit the output orifice but not to form droplets that will reach the plasma initiation site. The electrostatic droplet formation mechanism at least in part may then control the formation of a target droplet and/or the speed of the target droplet intermediate the output orifice and the plasma initiation site. Also alternatively, the pressure applied to the target droplet material may comprise sufficient pressure to cause the target material to reach the output orifice but not sufficient pressure to cause the target material to exit the output orifice, e.g., due to surface tension on the liquid target material at the exit of the output orifice and the electrostatic droplet formation mechanism at least in part may then control the formation of a target droplet and the speed of the target droplet intermediate the output orifice and the plasma initiation site.

It will be understood by those skilled in the art that, as noted above, the target delivery system may be of various types including, e.g., a capillary and orifice/nozzle arrangement wherein the liquid target material exits the target delivery system output orifice and immediately forms a droplet, e.g., due the pressure or vibration or both applied to the capillary passage and/or output orifice itself or a stream of liquid target material may exit and spontaneously break into droplets. The size and spacing of the droplets may be controlled in part by the geometry of the target droplet delivery system, the type of target liquid and its properties, the pressure applied to the target material liquid and the like, as is well known. The electrostatic droplet formation mechanism may then act in a variety of ways to stimulate the droplet formation, e.g., by drawing the droplets out of the output orifice, including, e.g., controlling droplet formation and acceleration towards the electrostatic droplet formation mechanism, e.g., in either a steady state droplet formation at some selected droplet formation rate, e.g., as may also be modified by the control system. The electrostatic droplet formation mechanism may simply accelerate the droplets after formation, e.g., from a droplet forming stream or as formed at the output orifice and also may influence droplet formation and/or acceleration as part of a DoD system. According to aspects of an embodiment of the present invention the electrostatic droplet formation mechanism may comprise a modulator modulating the charge on the charged element to influence the droplet formation and/or speed of only those droplets traveling substantially along the desired target droplet path, e.g., by not having been deflected from the target droplet path.

It will further be understood by those skilled in the art that according to aspects of an embodiment f the present invention there is disclosed an EUV plasma formation target delivery system which may comprise: a target droplet formation mechanism comprising a magneto-restrictive or electro-restrictive material cooperating with a target droplet delivery capillary and/or nozzle in the formation of liquid target material droplets. The target droplet formation mechanism may comprise a modulator modulating the application of magnetic or electric stimulation to, respectively, the magneto-restrictive or electro-restrictive material. The magneto-restrictive material and/or electro-restrictive material may form a sleeve around the capillary tube or form a mass adjacent to one portion of the capillary tube, e.g., in the former case to squeeze the capillary tube within the sleeve or in the latter case to vibrate the capillary tube by, e.g., alternately pushing against and not pushing against the capillary tube. The modulator(s) may be modulated to produce an essentially constant stream of droplets for irradiation at a plasma initiation site or to produce droplets on demand for irradiation at a plasma initiation site.

It will also be understood by those skilled in the art that according to aspects of an embodiment of the present invention an EUV target delivery system is disclosed which may comprise a liquid target delivery system target material reservoir; a target material purification system connected to deliver liquid target material to the target material reservoir comprising: a first container and a second container in fluid contact with the target material reservoir; a filter intermediate the first chamber and the second chamber; a liquid target material agitation mechanism cooperatively associated with the second container an operative to rotate the liquid target material within the second container to remove surface film to agitate the liquid target material in the second container to prevent surface film from forming on the exposed surface of the liquid target material or remove surface film formed on the exposed surface of the liquid target material. The liquid target material agitation mechanism may comprise an electromagnetic or magnetic stirring mechanism at least partly positioned outside of the second container.

The liquid target material agitation mechanism may comprise an electromagnetic or magnetic stirring mechanism at least part of which is positioned within the second container, e.g., a swirling mechanism positioned within the second container or a flopping mechanism positioned within the second container. An example of the former may be, e.g., vanes, e.g., like those in a centrifugal induction pump, which may be driven inductively in the fashion of an induction pump by, e.g., a rotating magnetic or electrical field generated externally to the container and influencing the rotation of the swirling movement within the container, e.g., to create a flow from generally the central region of the reservoir towards the interior walls of the container. This may serve to mechanically remove the surface film formed by contaminants to the wall and prevent flow of the contaminants through the center orifice. In the case of the flopping mechanism it may comprise, e.g., a loop or cylinder or plunger driven in a direction parallel to a centerline axis of the container, e.g., to create waves on the surface of the liquid target material to move any forming or formed surface films in the direction of the container walls for the purposes just noted, or may comprise elements driven radially from the centerline axis toward the container walls for similar reasons regarding the breakup of forming or formed surface film and these may all be driven by an electromagnetic or magnetic driver external to the second container. The filter may comprise a mechanism for removing impurities from the liquid target material such as compounds of lithium with $O_2$, $N_2$ and/or $H_2O$.

It will also be understood that according to aspects of an embodiment of the present invention an EUV target delivery system is disclosed that may comprise a liquid target delivery system target material reservoir; an inert gas pressurizing unit applying pressure to the interior of the reservoir comprising an inert gas; and an inert gas purification system connected to deliver the inert gas to the liquid target material reservoir interior which may comprise an inert gas supply container; at least one purification chamber containing the target material in a form reactive with impurities contained in the inert gas reacting with such impurities and removing from the inert gas the impurities in sufficient quantity that such impurities are substantially removed from the inert gas such that reactions between the target material and such impurities are substantially prevented from forming substantial amounts of target material-impurity compounds when the inert gas contacts the liquid target material in the liquid target material reservoir. The at least one purification chamber may comprise a plurality of purification chambers.

According to aspects of an embodiment of the present invention an EUV target delivery method may comprise providing an evaporation chamber in fluid communication with an impurity chamber and with a target droplet mechanism liquid target material reservoir and containing liquid source material; heating the liquid source material to a first temperature sufficient to evaporate first contaminants with relatively low vapor pressures. The source material may comprise, e.g., lithium or tin. The first contaminants comprise materials from a group comprising Na and/or K or similar impurities found in plasma source materials with sufficiently low vapor pressure to be evaporated in the first evaporation chamber, such evaporation pressures being substantially below that of, e.g., lithium. The second contaminants may comprise materials from a group comprising Fe, Si, Al, Ni or like impurities found in plasma source materials with sufficiently high vapor pressures to not be evaporated in the first evaporation chamber. At, e.g., 700-900° C. Lithium evaporates intensely enough to provide the required mass consumption rate. At 500-600° C. impurities, e.g., Na and K evaporate much more intensely that Li.

According to aspects of an embodiment of the present invention an EUV target delivery system is disclosed which may comprising a liquid target material delivery mechanism comprising a liquid target material delivery passage having an input opening and an output orifice; an electromotive disturbing force generating mechanism generating a disturbing force within the liquid target material as a result of an electrical or magnetic or acoustic field or combination thereof applied to the liquid target material intermediate the input opening and output orifice. The electromotive disturbing force generating mechanism may comprise a current generating mechanism generating a current through the liquid target material; and a magnetic field generating mechanism generating a magnetic field through the liquid target material generally orthogonal to the direction of current flow through the liquid target material. The mechanism may also comprise a modulating mechanism modulating one or the other or both of the current generating mechanism and the magnetic field generating mechanism. The current generating mechanism may comprise a first electrical contact in electrical contact with the liquid target material at a first position intermediate input opening and the output orifice; a second electrical contact in electrical contact with the liquid target material at a second position intermediate the input opening and the output orifice; a current supply electrically connected to the first and second electrical contacts. The magnetic field generating mechanism may comprise at least one permanent magnet or electromagnet. The modulation may be selected from the group comprising pulsed or periodic modulation.

It will further be understood that the target delivery system may comprise a liquid target delivery droplet formation mechanism having an output orifice; and a wetting barrier around the periphery of the output orifice, which output orifice may comprise a pinhole nozzle. The wetting barrier may comprise a liquid gathering structure separated from the output orifice, such as, e.g., an annular ring-like grove or a series of grooves/slots spaced apart from each other generally in the shape of arcs of an annular ring-line groove or a groove spaced apart from the output orifice and surrounding the output orifice forming a continuous perimeter of a selected geometry around the output orifice or a series of grooves spaced apart from the output orifice and spaced apart from each other surrounding the output orifice forming a broken perimeter of a selected geometry around the output orifice.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. In additions to changes and modifications to the disclosed and claimed aspects of embodiments of the present invention(s) noted above the following could be implemented.

I claim:

1. An EUV target delivery system comprising:
a liquid target delivery system target material reservoir;
a target material purification system connected to deliver liquid target material to the target material reservoir comprising:
a first container and a second container in fluid contact with the target material reservoir;
a filter intermediate the first container and the second container;
a liquid target material agitation mechanism cooperatively associated with the second container an operative to rotate the liquid target material within the second container to remove surface film to agitate the liquid target material in the second container to prevent surface film from forming on the exposed surface of the liquid target material or remove surface film formed on the exposed surface of the liquid target material.

2. The system of claim 1 further comprising:
the liquid target material agitation mechanism comprising an electromagnetic or magnetic stirring mechanism at least partly positioned outside of the second container.

3. The system of claim 2 further comprising:
the liquid target material agitation mechanism comprising an electromagnetic or magnetic stirring mechanism at least part of which is positioned within the second container.

4. The system of claim 3 further comprising:
the liquid material agitation mechanism comprising a swirling mechanism positioned within the second container.
5. The system of claim 4 further comprising:
the swirling mechanism is driven by an electromagnetic or magnetic driver external to the second container.
6. The system of claim 5 further comprising:
the filter comprising a mechanism for removing impurities from the liquid target material such as compounds of $O_2$, $N_2$ and/or $H_2O$.
7. The system of claim 6 further comprising:
the liquid target material agitation mechanism comprising a moving magnetic field inducing rotational motion in the liquid target material due to the passage of a rotating magnetic field through the liquid target material.
8. The system of claim 3 further comprising:
the liquid material agitation mechanism comprising a flopping mechanism positioned within the second container.
9. The system of claim 8 further comprising:
the flopping mechanism is driven by an electromagnetic or magnetic driver external to the second container.
10. The system of claim 9 further comprising:
the filter comprising a mechanism for removing impurities from the liquid target material such as compounds of $O_2$, $N_2$ and/or $H_2O$.
11. The system of claim 9 further comprising:
the liquid target material agitation mechanism comprising a moving magnetic field inducing rotational motion in the liquid target material due to the passage of a rotating magnetic field through the liquid target material.
12. The system of claim 1 further comprising:
the liquid target material agitation mechanism comprising an electromagnetic or magnetic stirring mechanism at least part of which is positioned within the second container.
13. The system of claim 12 further comprising:
the liquid material agitation mechanism comprising a swirling mechanism positioned within the second container.
14. The system of claim 13 further comprising:
the swirling mechanism is driven by an electromagnetic or magnetic driver external to the second container.
15. The system of claim 14 further comprising:
the filter comprising a mechanism for removing impurities from the liquid target material such as compounds of $O_2$, $N_2$ and/or $H_2O$.
16. The system of claim 15 further comprising:
the liquid target material agitation mechanism comprising a moving magnetic field inducing rotational motion in the liquid target material due to the passage of a rotating magnetic field through the liquid target material.
17. The system of claim 12 further comprising:
the liquid material agitation mechanism comprising a flopping mechanism positioned within the second container.
18. The system of claim 17 further comprising:
the flopping mechanism is driven by an electromagnetic or magnetic driver external to the second container.
19. The system of claim 18 further comprising:
the filter comprising a mechanism for removing impurities from the liquid target material such as compounds of $O_2$, $N_2$ and/or $H_2O$.
20. The system of claim 18 further comprising:
the liquid target material agitation mechanism comprising a moving magnetic field inducing rotational motion in the liquid target material due to the passage of a rotating magnetic field through the liquid target material.

21. An EUV target delivery system comprising:
a liquid target delivery system target material reservoir;
an inert gas pressurizing unit applying pressure to the interior of the reservoir comprising an inert gas; and
an inert gas purification system connected to deliver the inert gas to the liquid target material reservoir interior comprising:
an inert gas supply container;
at least one purification chamber containing the target material in a form reactive with impurities contained in the inert gas reacting with such impurities and removing from the inert gas the impurities in sufficient quantity that such impurities are substantially removed from the inert gas such that reactions between the target material and such impurities are substantially prevented from forming substantial amounts of target material-impurity compounds when the inert gas contacts the liquid target material in the liquid target material reservoir.
22. The system of claim 21 further comprising:
the at lest one purification chamber comprises a plurality of purification chambers.
23. An EUV target delivery method comprising:
providing an evaporation chamber in fluid communication with an impurity chamber and with a target droplet mechanism liquid target material reservoir and containing liquid source material;
heating the liquid source material to a first temperature sufficient to evaporate a first set of contaminants but not a second set of contaminants;
heating the liquid source material to a second temperature sufficient to evaporate lithium and leave the second set of contaminants behind.
24. The method of claim 23 further comprising:
the source material comprises lithium.
25. The method of claim 24 further comprising:
the first contaminants comprise materials from a group comprising Na and/or K.
26. The method of claim 25 further comprising:
the second contaminants comprise materials from a group comprising Fe, Si, Al, and Ni.
27. The method of claim 24 further comprising:
the second contaminants comprise materials from a group comprising Fe, Si, Al, and Ni.
28. The method of claim 23 further comprising:
the source material comprises tin.
29. The method of claim 28 further comprising:
the first contaminants comprise materials from a group comprising Na and/or K.
30. The method of claim 29 further comprising:
the second contaminants comprise materials from a group comprising Fe, Si, Al, and Ni.
31. The method of claim 28 further comprising:
the second contaminants comprise materials from a group comprising Fe, Si, Al, and Ni.
32. The method of claim 23 further comprising:
the first contaminants comprise materials from a group comprising Na and/or K.
33. The method of claim 32 further comprising:
the second contaminants comprise materials from a group comprising Fe, Si, Al, and Ni.
34. The method of claim 23 further comprising:
the second contaminants comprise materials from a group comprising Fe, Si, Al, and Ni.
35. An EUV target delivery system comprising:
a liquid target delivery system target material reservoir;

a target material purification system connected to deliver liquid target material to the target material reservoir comprising:

at least one container in fluid contact with the target material reservoir;

a liquid target material agitation mechanism cooperatively associated with the at least one container an operative to rotate the liquid target material within the at least one container to remove surface film to agitate the liquid target material in the at least one container to prevent surface film from forming on the exposed surface of the liquid target material or remove surface film formed on the exposed surface of the liquid target material.

36. The system of claim 35 further comprising:
the liquid target material agitation mechanism comprising an electromagnetic or magnetic stirring mechanism at least partly positioned outside of the at least one container.

37. The system of claim 36 further comprising:
the liquid target material agitation mechanism comprising an electromagnetic or magnetic stirring mechanism at least part of which is positioned within the at least one container.

38. The system of claim 37 further comprising:
the liquid material agitation mechanism comprising a swirling mechanism positioned within the at least one container.

39. The system of claim 38 further comprising:
the liquid material agitation mechanism comprising a flopping mechanism positioned within the at least one container.

40. The system of claim 37 further comprising:
the liquid material agitation mechanism comprising a flopping mechanism positioned within the at least one container.

41. The system of claim 40 further comprising:
a filter comprising a mechanism for removing impurities from the liquid target material such as compounds of $O_2$, $N_2$ and/or $H_2O$.

42. The system of claim 37 further comprising:
the liquid target material agitation mechanism comprising a moving magnetic field inducing rotational motion in the liquid target material due to the passage of a rotating magnetic field through the liquid target material.

43. The system of claim 36 further comprising:
the liquid material agitation mechanism comprising a flopping mechanism positioned within the at least one container.

44. The system of claim 43 further comprising:
a filter comprising a mechanism for removing impurities from the liquid target material such as compounds of $O_2$, $N_2$ and/or $H_2O$.

45. The system of claim 36 further comprising:
the liquid target material agitation mechanism comprising a moving magnetic field inducing rotational motion in the liquid target material due to the passage of a rotating magnetic field through the liquid target material.

46. The system of claim 35 further comprising:
the liquid target material agitation mechanism comprising an electromagnetic or magnetic stirring mechanism at least part of which is positioned within the at least one container.

47. The system of claim 46 further comprising:
the liquid material agitation mechanism comprising a swirling mechanism positioned within the at least one container.

48. The system of claim 47 further comprising:
the liquid material agitation mechanism comprising a flopping mechanism positioned within the at least one container.

49. The system of claim 46 further comprising:
the liquid material agitation mechanism comprising a flopping mechanism positioned within the at least one container.

50. The system of claim 49 further comprising:
a filter comprising a mechanism for removing impurities from the liquid target material such as compounds of $O_2$, $N_2$ and/or $H_2O$.

51. The system of claim 46 further comprising:
the liquid target material agitation mechanism comprising a moving magnetic field inducing rotational motion in the liquid target material due to the passage of a rotating magnetic field through the liquid target material.

52. The system of claim 35 further comprising:
the liquid material agitation mechanism comprising a flopping mechanism positioned within the at least one container.

53. The system of claim 52 further comprising:
a filter comprising a mechanism for removing impurities from the liquid target material such as compounds of $O_2$, $N_2$ and/or $H_2O$.

54. The system of claim 35 further comprising:
the liquid target material agitation mechanism comprising a moving magnetic field inducing rotational motion in the liquid target material due to the passage of a rotating magnetic field through the liquid target material.

* * * * *